(12) United States Patent
Lee et al.

(10) Patent No.: US 11,653,512 B2
(45) Date of Patent: May 16, 2023

(54) LIGHT-EMITTING DIODE AND LIGHT-EMITTING DEVICE WITH REDUCED HOLE AND CURRENT LEAKAGES

(71) Applicant: LG Display Co., Ltd., Seoul (KR)

(72) Inventors: Seung-Jae Lee, Paju-si (KR); Jong-Kwan Bin, Paju-si (KR); Na-Yeon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 113 days.

(21) Appl. No.: 16/170,938

(22) Filed: Oct. 25, 2018

(65) Prior Publication Data

US 2019/0131557 A1   May 2, 2019

(30) Foreign Application Priority Data

Oct. 26, 2017   (KR) ......................... 10-2017-0140168

(51) Int. Cl.
*H10K 10/40*   (2023.01)
*H10K 50/11*   (2023.01)
*H10K 101/40*  (2023.01)

(52) U.S. Cl.
CPC .......... *H10K 50/11* (2023.02); *H10K 50/166* (2023.02); *H10K 50/18* (2023.02); *H10K 85/1135* (2023.02); *H10K 85/626* (2023.02); *H10K 85/6572* (2023.02); *H10K 50/115* (2023.02); *H10K 59/12* (2023.02); *H10K 2101/30* (2023.02); *H10K 2101/40* (2023.02); *H10K 2102/00* (2023.02)

(58) Field of Classification Search
CPC ............. H01L 51/5004; H01L 51/0037; H01L 51/508; H01L 51/502
See application file for complete search history.

(56) References Cited

U.S. PATENT DOCUMENTS

| 9,755,171 B2 | 9/2017 | Seo et al. |
| 9,768,404 B1* | 9/2017 | Steckel ............... H01L 27/1225 |
| 2002/0051896 A1* | 5/2002 | Seo ..................... H01L 51/0077 |
| | | 313/506 |
| 2009/0039764 A1* | 2/2009 | Cho .................... H01L 51/5048 |
| | | 313/504 |

(Continued)

FOREIGN PATENT DOCUMENTS

| CN | 106611821 A | 5/2017 |
| KR | 10-2011-0085480 A | 7/2011 |

(Continued)

*Primary Examiner* — Didarul A Mazumder
*Assistant Examiner* — Gustavo G Ramallo
(74) *Attorney, Agent, or Firm* — Seed IP Law Group LLP

(57) ABSTRACT

According to principals as disclosed herein an organic, light emitting diode assembly is provided having a first electrode. An electron injection layer is adjacent to the first electrode. A first electron transport layer composed of inorganic material is adjacent to the electron injection layer. A second electron transport layer composed of organic material is adjacent to the first electron transport layer and in contact with an organic light emitting material layer. The organic light emitting material layer is in direct, abutting contact with the second electron transport layer. A hole transport layer is adjacent to the organic light emitting material layer and a second electrode is adjacent to the hole transport layer.

21 Claims, 8 Drawing Sheets

(56) References Cited

U.S. PATENT DOCUMENTS

| | | | |
|---|---|---|---|
| 2009/0212688 A1* | 8/2009 | Song | H01L 51/5088 |
| | | | 313/504 |
| 2013/0228753 A1* | 9/2013 | Moon | H01L 51/508 |
| | | | 257/40 |
| 2014/0117325 A1* | 5/2014 | Kwak | H01L 51/5004 |
| | | | 257/40 |
| 2016/0149150 A1* | 5/2016 | Seo | H01L 51/5072 |
| | | | 257/40 |
| 2017/0221969 A1* | 8/2017 | Steckel | H01L 27/3211 |
| 2017/0271605 A1 | 9/2017 | Steckel et al. | |
| 2018/0138434 A1* | 5/2018 | Yoon | H01L 51/502 |
| 2019/0123283 A1* | 4/2019 | Kathirgamanathan | |
| | | | C07D 339/08 |

FOREIGN PATENT DOCUMENTS

| | | |
|---|---|---|
| KR | 10-2017-0040851 A | 4/2017 |
| KR | 10-2017-0049702 A | 5/2017 |

\* cited by examiner

LIGHT-EMITTING DIODE AND LIGHT-EMITTING DEVICE WITH REDUCED HOLE AND CURRENT LEAKAGES

CROSS-REFERENCE TO RELATED APPLICATIONS

This application claims the benefit under 35 U.S.C. § 119(a) of Korean Patent Application No. 10-2017-0140168, filed in Korea on Oct. 26, 2017, which is incorporated herein by reference in its entirety.

BACKGROUND

Technical Field

The present disclosure relates to a light-emitting diode, and more specifically, to a light-emitting diode having improved luminous efficiency, and a light-emitting device including the same.

Description of the Related Art

Various flat panel display devices replacing the conventional cathode ray tube (CRT) have been developed. Among flat panel display devices, since an organic light-emitting diode (OLED) display device and a quantum dot light-emitting diode (QLED) display device may be formed in a thin structure and have low power consumption, the OLED display device and the QLED display device have attracted a lot of attention as a next-generation display device which replaces a liquid crystal display (LCD).

An OLED or a QLED is a device in which, when electric charges are injected into an organic emissive layer formed between an electron injection electrode (i.e., cathode) and a hole injection electrode (i.e., anode), electrons and holes are paired and then combined to emit light during this combination process. Not only may the OLED or the QLED may be formed even on a flexible transparent substrate such as a plastic substrate, but also it is possible to be driven at a low voltage of 10 V or less. Power consumption of the OLED or the QLED is relatively low, and color purity thereof is high.

FIG. 1 is a schematic diagram illustrating bandgap energies of electrodes constituting a conventional OLED and materials constituting a conventional emissive layer. Referring to FIG. 1, the OLED includes an anode and a cathode, which face each other, an emitting material layer EML disposed between the anode and the cathode, a hole injection layer HIL and a hole transport layer HTL, which are disposed between the anode and the emitting material layer EML, and an electron transport layer ETL disposed between the cathode and the emitting material layer EML.

As described above, an OLED is a device in which, when electric charges are injected into an organic emissive layer formed between an electron injection electrode Cathode and a hole injection electrode Anode, electrons and holes are paired and then disappear to emit light. The emitting material layer EML is made of a light-emitting material. Holes injected from the anode and electrons injected from the cathode meet in the emitting material layer EML to form excitons. The light-emitting material included in the emitting material layer EML becomes an excited state due to such energy, and energy of the organic compound transitions the excited state to a ground state, thereby converting generated energy to emit light.

The hole transport layer HTL and the hole injection layer HIL transport and inject positive charge carriers, i.e., holes, into the emitting material layer EML from the anode, and the electron transport layer ETL transports and injects negative charge carriers, i.e., electrons, into the emitting material layer EML from the cathode. In order to transport and inject holes and electrons into the emitting material layer EML, each of the layers should be made of a material with appropriate bandgap energy. In an example, the hole injection layer HIL may be made of poly(3,4-ethylenedioxythiophene) polystyrene sulfonate (PEDOT:PSS), and the hole transport layer HTL may be made of poly(4-butylphenyl-diphenyl-amine) (poly-TPD). The electron transport layer ETL may be made of lithium quinolate (LiQ).

However, when an organic compound is used as a material of the electron transport layer ETL, a difference $\Delta G_H$ between a highest occupied molecular orbital (HOMO) energy level of a light-emitting material, which is used in the emitting material layer EML, and a HOMO energy level of the organic material, which is used as the material of the electron transport layer ETL, is not great. As described above, due to the relatively high HOMO energy level of the organic material used in the electron transport layer ETL, the difference $\Delta G_H$ between the HOMO of the electron transport layer ETL and the HOMO energy level of the emitting material layer EML is small. Thus, some of the holes injected into the emitting material layer EML are leaked into the electron transport layer ETL. In particular, current leakage is highly problematic in a QLED in which an emitting material layer EML includes an inorganic luminescent material having a valence band energy level deeper than a HOMO energy level of an organic material for transporting electrons in an electron transport layer ETL.

A lowest unoccupied molecular orbital (LUMO) energy level of the organic material used in the electron transport layer ETL is considerably greater than a conduction band energy level of a cathode. Since a difference $\Delta G_{L1}$ between the conduction band energy level of the cathode and the LUMO energy level of the electron transport layer ETL is considerably great, an energy barrier is formed between the cathode and the electron transport layer ETL, and thus, the injection of electrons generated in the cathode into the electron transport layer ETL is delayed.

When inorganic light-emitting materials such as quantum dots are used as a light-emitting material constituting the emitting material layer EML, a LUMO energy level of the inorganic light-emitting materials is also very deep. When the organic material constituting the electron transport layer ETL has a high LUMO energy level, a difference $\Delta G_{L2}$ between a LUMO energy level of the electron transport layer ETL and a LUMO energy level of the emitting material layer EML is excessively increased. Thus, the injection of electrons into the emitting material layer EML may also be delayed.

As described above, in the conventional OLED, as some of the holes injected into the emitting material layer EML do not form excitons and are leaked into an electron transport layer ETL, the number of holes, which do not contribute to the emission, are increased. In addition, since the injection of electrons generated in the cathode into the electron transport layer ETL and the emitting material layer EML is delayed, electrons may not be rapidly injected into the emitting material layer EML. The injections of holes and electrons into the emitting material layer EML may not be balanced, luminous efficiency of an LED is decreased, and quantum efficiency thereof is decreased. In addition, since a high voltage should be applied to the LED in order to realize effective light emission, a driving voltage of the LED rises.

BRIEF SUMMARY

Accordingly, the present disclosure is directed to a light-emitting diode and a light-emitting device including the same that reduce one or more of the problems due to the limitations and disadvantages of the related art.

An object of the present disclosure is to provide a light-emitting diode in which there are no hole leakage and current leakage and charges are injected into an emitting material layer in a balanced manner, and a light-emitting device including the diode.

Another object of the present disclosure is to provide a light-emitting diode having improved emission properties such as luminous efficiency and quantum efficiency, and a light-emitting device including the diode.

According to an aspect of the present disclosure, the present disclosure provides a light-emitting diode in which an electron transfer layer between two electrodes includes a first electron transport layer of an organic material and a second electron transport layer of an inorganic material.

In this case, the first electron transport layer induces electrons to be injected into an emitting material layer at a desired energy level. The second electron transport layer prevents holes injected into the emitting material from being leaked.

According to another aspect of the present disclosure, the present disclosure provides a light-emitting device, for example, a light-emitting display device, including: a substrate; the light-emitting diode on the substrate; and a thin film transistor between the substrate and the light-emitting diode and connected to the light-emitting diode.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Hereinafter, the present disclosure will be described with reference to the accompanying drawings in case of need.

Figure 2:
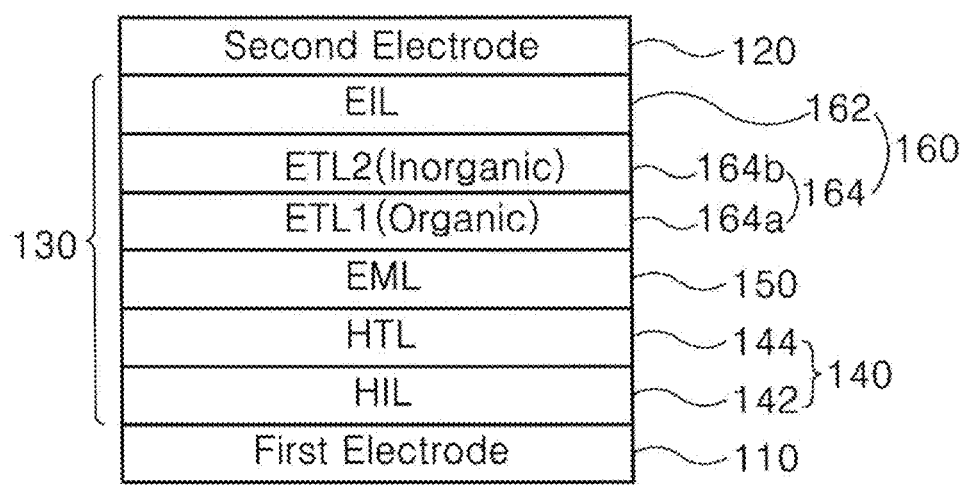
FIG. 2 is a schematic cross-sectional view illustrating an LED having a first structure according to a first exemplary embodiment of the present disclosure.
Figure 3:
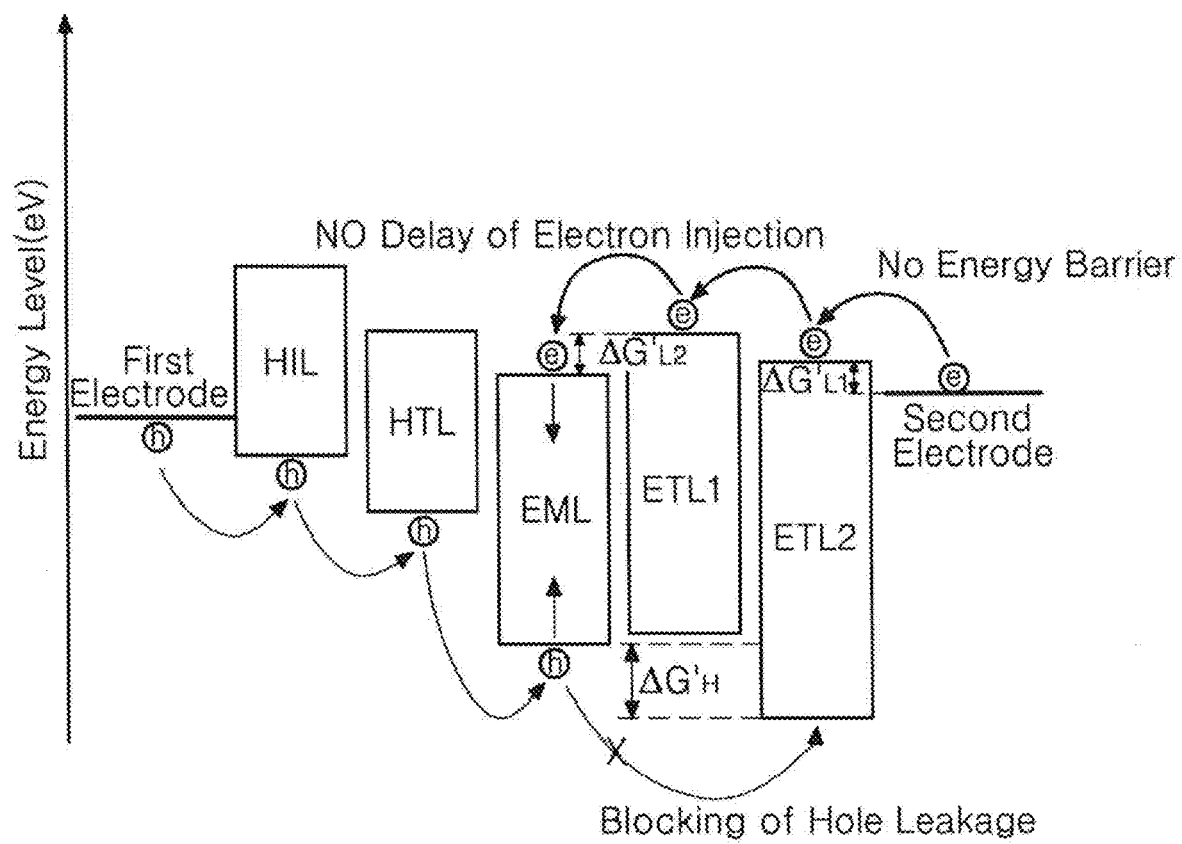
FIG. 3 is a schematic diagram illustrating bandgap energies of electrodes constituting the LED according to the first exemplary embodiment of the present disclosure and materials constituting a emissive layer.

FIG. 2 is a schematic cross-sectional view illustrating a light-emitting diode (LED) 100 having a first structure according to a first exemplary embodiment of the present disclosure, and FIG. 3 is a schematic diagram illustrating bandgap energies of electrodes constituting the LED 100 according to the first exemplary embodiment of the present disclosure and materials constituting an emissive layer 130.

As shown in FIG. 2, the LED 100 according to the exemplary embodiment of the present disclosure includes a first electrode 110, and a second electrode 120 facing the first electrode 110, and the emissive layer 130 disposed between the first electrode 110 and the second electrode 120 and including an EML 150. In an example, the emissive layer 130 may further include a first charge transfer layer 140 disposed between the first electrode 110 and the EML 150 and a second charge transfer layer 160 disposed between the EML 150 and the second electrode 120.

In the first exemplary embodiment of the present disclosure, the first electrode 110 may be an anode such as a hole injection electrode. The first electrode 110 may be formed on a substrate (not shown in FIG. 2), which may be made of glass or a polymer. In an example, the first electrode 110 may be made of at least one selected from doped or undoped metal oxides including indium tin oxide (ITO), indium zinc oxide (IZO), indium tin zinc oxide (ITZO), indium copper oxide (ICO), tin oxide ($SnO_2$), indium oxide ($In_2O_3$), cadmium:zinc oxide (Cd:ZnO), fluorine:tin oxide ($F:SnO_2$), indium:tin oxide ($In:SnO_2$), gallium:tin oxide ($Ga:SnO_2$), and aluminum:zinc oxide (Al:ZnO (AZO)). Selectively, the first electrode 110 may be made of a metal material such as nickel (Ni), platinum (Pt), gold (Au), silver (Ag), or iridium (Ir), or a nonmetal material such as a carbon nanotube (CNT) in addition to the above-described metal oxides.

In the first exemplary embodiment of the present disclosure, the second electrode 120 may be a cathode such as an electron injection electrode. In an example, the second electrode 120 may be made of at least one selected from Ca, Ba, Ca/Al, LiF/Ca, LiF/Al, $BaF_2$/Al, CsF/Al, $CaCO_3$/Al, $BaF_2$/Ca/Al, Al, Mg, Au:Mg, and Ag:Mg. For example, each of the first electrode 110 and the second electrode 120 may be stacked to have a thickness of about 30 nm to about 300 nm.

In an exemplary embodiment, in the case of a bottom emission-type LED, the first electrode 110 may be made of a transparent conductive material such as ITO, IZO, ITZO, or AZO, and the second electrode 120 may be made of an opaque or reflective conductor such as Ca, Ba, Ca/Al, LiF/Ca, LiF/Al, $BaF_2$/Al, Al, Mg, an Ag:Mg alloy, or the like.

The first charge transfer layer 140 constituting the emissive layer 130 is disposed between the first electrode 110 and the EML 150. In the first exemplary embodiment of the present disclosure, the first charge transfer layer 140 may be a hole transfer layer configured to supply holes to the EML 150. In an example, the first charge transfer layer 140 includes a hole injection layer HIL 142 disposed adjacent to the first electrode 110 between the first electrode 110 and the EML 150 and a hole transport layer HTL 144 disposed adjacent to the EML 150 between the first electrode 110 and the EML 150.

The HIL 142 facilitates the injection of holes into the EML 150 from the first electrode 110. In an example, the HIL 142 may be made of an organic material selected from the group including poly(ethylenedioxythiophene):polystyrenesulfonate (PEDOT:PSS), 4,4',4"-tris(diphenylamino)triphenylamine (TDATA) doped with tetrafluoro-tetracyanoquinodimethane (F4-TCNQ), e.g., p-doped phthalocyanine such as zinc phthalocyanine (ZnPc) doped with F4-TCNQ, N,N'-diphenyl-N,N'-bis(1-naphtyl)-1,1'-biphenyl-4,4"-diamine (α-NPD) doped with F4-TCNQ, hexaazatriphenylene-hexanitrile (HAT-CN), and combinations thereof, but the present disclosure is not limited thereto. In an example, a dopant such as F4-TCNQ may be doped at a ratio of about 1 wt % to about 30 wt % with respect to the weight of a host. The HIL 142 may be omitted according to the structure and shape of the LED 100.

The HTL 144 transports holes from the first electrode 110 to the EML 150. The HTL 144 may be made of an inorganic material or an organic material. In an example, when the HTL 144 is made of the organic material, the HTL 144 may be made of an organic material selected from the group including arylamines such as 4,4'-N,N'-dicarbazolyl-biphenyl (CBP), N,N'-diphenyl-N,N'-bis(1-naphtyl)-1,1'-biphenyl-4,4"-diamine (α-NPD), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenyl-benzidine (DNTPD), 4,4',4"-tris(N-carbazolyl)-triphenylamine (TCTA), 4,4',4"-tris((3-methylphenylphenyl)amino)triphenylamine (m-MTDATA), poly(9,9'-dioctylfluorenyl-2,7-diyl)-co-(4,4'-(N-(4-sec-butylphenyl)diphenylamine (TFB), and poly(4-butylphenyl-diphnehyl amine (poly-TPD); polyaniline; polypyrrole; poly(p-phenylenevinylene) (PPV) and a derivative thereof such as poly[2-methoxy-5-(2-ethylhexyloxy)-1,4-phenylenevinylene (MEH-PPV) or poly[2-methoxy-5-(3',7'-dimethyloctyloxy)-1,4-phenylenevinylene (MOMO-PPV); copper phthalocyanine; an aromatic tertiary amine or polynuclear aromatic tertiary amine; a 4,4'-bis(p-carbazolyl)-1,1'-biphenyl compound; N,N,N',N'-tetraarylbenzidine; PEDOT:PSS and a derivative thereof poly(N-vinylcarbazole) (PVK) and a derivative thereof polymethacrylate and a derivative thereof; poly(9,9-octylfluorene) and a derivative thereof; poly(spiro-fluorene) and a derivative thereof; N,N'-di(naphthalene-1-yl)-N,N'-diphenyl-benzidine (NPB); Spiro-NPB; and combinations thereof.

When the HTL 144 is made of an inorganic material, the HTL 144 may be made of an inorganic material selected from the group including metal oxides such as NiO, $MoO_3$, $Cr_2O_3$, $Bi_2O_3$, or p-type ZnO; a non-oxide equivalent such as copper thiocyanate (CuSCN), $Mo_2S$, or p-type GaN; and combinations thereof.

The first charge transfer layer 140 is divided into the HIL 142 and the HTL 144 in the drawings, but the first charge transfer layer 140 may be formed as a single layer. For example, the HIL 142 may be omitted, and the first charge transfer layer 140 may include only the hole transfer layer 144 and may be formed by doping a hole injection material (for example, PEDOT:PSS) into the above-described hole transport organic material.

The first charge transfer layer 140 including the HIL 142 and the HTL 144 may be formed using a vacuum deposition process including a vacuum vapor deposition process and a sputtering process, or a solution process such as one from a spin coating method, a drop coating method, a dip coating method, a spray coating method, a roll coating method, a flow coating method, a casting process, a screen printing method, and an inkjet printing method, or combinations thereof. For example, each of the HIL 142 and the HTL 144 may have a thickness of about 10 nm to about 200 nm, preferably, a thickness of about 10 nm to about 100 nm, but the present disclosure is not limited thereto.

The EML 150 may be made of inorganic luminescent particles or an organic light-emitting material. When the EML 150 is made of the inorganic luminescent particles, the inorganic luminescent particles may include inorganic luminescent nanoparticles such as quantum dots (QDs) or quantum rods (QRs).

Quantum dots or quantum rods are inorganic particles in which electrons in an unstable state descend from a conduction band to a valence band to emit light. Since the inorganic luminescent nanoparticles have a very high extinction coefficient and high quantum yield among inorganic particles, the inorganic luminescent nanoparticles generate strong fluorescence. In addition, since an emission wavelength is changed according to a size of the inorganic luminescent nanoparticles, the size of the inorganic luminescent nanoparticles may be adjusted to obtain light in all bands of visible light, thereby realizing various colors. That is, when the inorganic luminescent nanoparticles such as the quantum dots or quantum rods are used as a light-emitting material of the EML 150, it is possible to increase the color purity of each pixel and realize white light composed by red (R) emission, green (G) emission, and blue (B) emission, having high purity.

In an exemplary embodiment, the quantum dots or quantum rods may have a single structure. In another exemplary embodiment, the quantum dots or quantum rods may have a heterostructure of a core/shell. In this case, the shell may be provided as one shell or a multi-shell.

A degree of growth, a crystal structure, and the like of the inorganic luminescent nanoparticles may be adjusted according to reactivity and an injection rate of a reaction precursor constituting the core and/or the shell, and a type and reaction temperature of a ligand. Thus, it is possible to induce emission of light having various wavelength ranges according to an adjustment of an energy bandgap.

In an example, quantum dots or quantum rods may have a heterostructure in which a core component emitting light is located at a center thereof and a shell surrounds a surface of the core to protect the core. A ligand component may surround a surface of the shell so as to disperse quantum dots or quantum rods in a solvent. For example, the quantum dots or quantum rods have a structure in which a component constituting the core and having an energy bandgap is surrounded by the shell having an energy bandgap. The quantum dots or quantum rods may have a type-I core/shell structure which is an illuminant in which electrons and holes move to the core and are recombined in the core to convert energy into light and emit the light.

When the quantum dots or quantum rods constitute the type-I core/shell structure, the core is a portion which substantially emits light, and an emission wavelength of the quantum dots or quantum rods is determined according to a size of the core. In order to obtain a quantum confinement effect, the core should have a size smaller than an exciton Bohr radius according to each material and should have an optical band gap at a corresponding size thereof.

The shell constituting the quantum dots or quantum rods promotes the quantum confinement effect of the core and determines stability of the quantum dots or quantum rods. Unlike internal atoms, atoms appearing on a surface of colloidal quantum dots or quantum rods having a single structure have lone pair electrons which do not participate in a chemical bond. Since an energy level of the surface atoms is placed between a conduction band edge and a valence band edge of the quantum dots or quantum rods, electric charges may be trapped to form surface defects. Due to a non-radiative recombination process of excitons, caused by the surface defects, luminous efficiency of the quantum dots or quantum rods can be reduced. In addition, the trapped electric charges react with external oxygen and compounds to cause a chemical composition variation of the quantum dots or quantum rods, or the quantum dots or quantum rods can permanently lose electrical/optical properties thereof.

Thus, in an exemplary embodiment, the quantum dots or quantum rods may have a heterostructure of a core/shell. In order for the shell to be efficiently formed on a surface of the core, a lattice constant of a material constituting the shell should be similar to a lattice constant of a material constituting the core. Since the surface of the core is surrounded by the shell, oxidation of the core can be prevented to improve chemical stability of the quantum dots or quantum rods, loss of excitons caused by a surface trapping on the surface of the core can be minimized, and energy loss due to molecular vibration can be prevented, thereby improving quantum efficiency.

Quantum dots or quantum rods may be semiconductor nanocrystals or metal oxide particles having a quantum confinement effect. For example, the quantum dots or quantum rods may include a group II-VI, group III-V, group IV-VI, or group I-III-VI compound semiconductor nanocrystals. More specifically, a core and/or a shell constituting the quantum dots or quantum rods may be II-VI group compound semiconductor nanocrystals such as CdS, CdSe, CdTe, ZnS, ZnSe, ZnTe, HgS, HgTe and/or combinations thereof; group III-V compound semiconductor nanocrystals such as GaP, GaAs, GaSb, InP, InAs, InSb, and/or combinations thereof; group IV-VI compound semiconductor nanocrystals such as PbS, PbSe, PbTe, and/or any combination thereof; group compound semiconductor nanocrystals such as $AgGaS_2$, $AgGaSe_2$, $AgGaTe_2$, $CuInS_2$, $CuInSe_2$, $CuGaS_2$, $CuGaSe_2$, and/or combinations thereof; metal oxide nanoparticles such as ZnO, $TiO_2$, and/or a combination thereof; and core-shell structured nanocrystals such as CdSe/ZnSe, CdSe/ZnS, CdS/ZnSe, CdS/ZnS, ZnSe/ZnS, InP/ZnS, ZnO/MgO, and/or any combination thereof. Semiconductor nanoparticles may be undoped or doped with a rare earth element such as Eu, Er, Tb, Tm, Dy, or any combination thereof, or may be doped with a transition metal element such as Mn, Cu, Ag, or any combination thereof.

For example, the core constituting the quantum dot or quantum rod may be selected from the group including ZnSe, ZnTe, CdSe, CdTe, InP, ZnCdS, $Cu_xIn_{1-x}S$, $Cu_xIn_{1-x}Se$, $Ag_xIn_{1-x}S$, and combinations thereof. In addition, the shell constituting the quantum dot or quantum rod may be selected from the group including ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, $Cd_xZn_{1-x}S$, and combinations thereof.

The quantum dots may be alloy quantum dots (QDs) (e.g., $CdS_xSe_{1-x}$, $CdSe_xTe_{1-x}$, or $Zn_xCd_{1-x}Se$), such as homogeneous alloy quantum dots or gradient alloy quantum dots.

When the EML 150 is made of inorganic luminescent particles such as quantum dots or quantum rods, the EML 150 is formed by applying a solution containing quantum dots or quantum rods in a solvent on the first charge transfer layer 140, for example, the HTL 144 through a process using the solution, and then, volatilizing the solvent.

In an exemplary embodiment, the EML 150 may be formed by applying a dispersion containing luminescent particles such as quantum dots or quantum rods in a solvent on the first charge transfer layer 140 through a solution process, and then, volatilizing the solvent. The EML 150 may be stacked by using a solution process such as one from among a spin coating method, a drop coating method, a dip coating method, a spray coating method, a roll coating method, a flow coating method, a casting process, a screen printing method, and inkjet printing method or combinations thereof.

In an exemplary embodiment, a white LED may be manufactured by including organic luminescent nanoparticles such as quantum dots or quantum rods, having about 440 nm, 530 nm, or 620 nm PL emission properties to the EML 150. Selectively, the EML 150 may include luminescent nanoparticles such as quantum dots or quantum rods, having any one color of a red color, a green color, and a blue color and may be implemented to individually emit any one of red light, green light, and blue light.

In another alternative embodiment, the EML 150 may be made of an organic light-emitting material. When the EML 150 is made of the organic light-emitting material, the organic light-emitting material is not particularly limited as long as it is a commonly used organic light-emitting material. For example, the EML 150 may include an organic light-emitting material emitting red light, green light, and/or blue light and may include a fluorescent material or a phosphorescent material. In addition, the organic light-emitting material constituting the EML 150 may include a host and a dopant. When the organic light-emitting material is configured as a host-dopant system, a dopant may be doped at a ratio of about 1-50 wt %, preferably, about 1-30 wt % with respect to the weight of a host, but the present disclosure is not limited thereto.

An organic host used in the EML 150 is not particularly limited and can be any commonly used material. In an example, the organic host used in the EML 150 may include at least one selected from tris(8-hydroxyquinoline)aluminum ($Alq_3$), TCTA, PVK, 4,4'-bis(N-carbazolyl)-1,1'-biphenyl (CBP), 4,4'-bis(9-carbazolyl)-2,2'-dimethylbiphenyl (CDBP), 9,10-di(naphthalene-2-yl)anthracene (ADN), 3-tert-butyl-9,10-di(naphtha-2-yl)anthracene (TBADN), 2-methyl-9,10-bis(naphthalene-2-yl)anthracene (MADN), 1,3,5-tris(N-phenylbenzimidazole-2-yl)benzene (TPBi), distyrylarylene (DSA), mCP, 1,3,5-tris(carbazol-9-yl)benzene (TCP), and the like.

When the EML 150 emits red light, a dopant included in the EML 150 may include an organic compound or an organic metal complex such as 5,6,11,12-tetraphenylnaphthalene (rubrene), bis(2-benzo[b]-thiophene-2-yl-pyridine)(acetylacetonate)iridium (III) ($Ir(btp)_2(acac)$), bis[1-(9,9-diemthyl-9H-fluoren-2-yl)-isoquinoline](acetylacetonate) iridium (III) ($Ir(fliq)_2(acac)$), bis[2-(9,9-diemthyl-9H-fluoren-2-yl)-quinoline](acetylacetonate)iridium (III) ($Ir(flq)_2(acac)$), bis-(2-phenylquinoline)(2-(3-methylphenyl)pyridinate)iridium (III) ($Ir(phq)_2typ$), or iridium(III)bis(2-

(2,4-difluorophenyl)quinoline)picolinate (FPQIrpic), but the present disclosure is not limited thereto.

When the EML 150 emits green light, a dopant included in the EML 150 may include an organic compound or an organic metal complex such as N,N'-dimethyl-quinacridone (DMQA), 9,10-bis[N,N-di-(p-tolyl)amino]anthracene (TTPA), 9,10-bis[phenyl(m-tolyl)-amino]anthracene (TPA), bis(2-phenylpyridine)(acetylacetonate)iridium (III) (Ir(ppy)$_2$(acac)), fac-tris(phenypyridine)iridium (III) (fac-Ir(ppy)$_3$), or tris[2-(p-tolyl)pyridine]iridium (III) (Ir(mppy)$_3$), but the present disclosure is not limited thereto.

When the EML 150 emits blue light, a dopant included in the EML 150 may include an organic compound or an organic metal complex such as 4,4'-bis[4-(di-p-tolylamino) styryl]biphenyl (DPAVBi), perylene, 2,5,8,11-tetra-tert-butylpherylene (TBPe), bis[3,5-difluoro-2-(2-pyridyl)phenyl-(2-carboxypyridyl)]iridium (III) (FirPic), mer-tris(1-phenyl-3-methylimidazolin-2-ylidene-C,C(2)'iridium (III) (mer-Ir(pmi)$_3$), or tris(2-(4,6-difuorophenyl)pyridine) iridium (III) (Ir(Fppy)$_3$), but the present disclosure is not limited thereto.

When the EML 150 is made of an organic light-emitting material, the EML 150 may be formed by using a vacuum deposition process including a vacuum vapor deposition process and a sputtering process, or a solution process such as one from among a spin coating method, a drop coating method, a dip coating method, a spray coating method, a roll coating method, a flow coating method, a casting process, a screen printing method, and an inkjet printing method or combinations thereof.

The second charge transfer layer 160 is disposed between the EML 150 and the second electrode 120. In the present embodiment, the second charge transfer layer 160 may be an electron transfer layer configured to supply electrons to the EML 150. In an exemplary embodiment, the second charge transfer layer 160 includes an electron injection layer EIL 162 disposed adjacent to the second electrode 120 between the second electrode 120 and the EML 150 and an electron transport layer ETL 164 disposed adjacent to the EML 150 between the second electrode 120 and the EML 150.

The EIL 162 facilitates the injection of electrons into the EML 150 from the second electrode 120. For example, the EIL 162 may be made of a material in which fluorine is doped into or bonded to a metal such as Al, Cd, Cs, Cu, Ga, Ge, In, or Li, or may be made of metal oxide such as titanium dioxide (TiO$_2$), zinc oxide (ZnO), zirconium oxide (ZrO), tin oxide (SnO$_2$), tungsten oxide (WO$_3$), or tantalum oxide (Ta$_2$O$_3$), which is doped or not doped with Al, Mg, In, Li, Ga, Cd, Cs, Cu, or the like.

The ETL 164 transports electrons to the EML 150. According to an exemplary embodiment according to the present disclosure, the ETL 164 includes a first electron transport layer ETL1 164a disposed adjacent to the EML 150 between the EML 150 and the second electrode 120 and a second electron transport layer ETL2 164b disposed between the ETL1 164a and the second electrode 120, for example, between the ETL1 164a and the EIL 162.

In this case, the ETL1 164a may be made of an organic material, and the ETL2 164b may be made of an inorganic material. That is, the ETL 164 according to the present disclosure has an organic-inorganic hybrid structure including two sequential ETLs made of an organic material and an inorganic material. In this case, the ETL1 164a made of the organic material may induce electrons generated in the second electrode 120 to be quickly and effectively injected into the EML 150. The ETL2 164b made of the inorganic material may prevent the electrons injected into the EML 150 from being leaked into the second electrode 120. The ETL1 164a is made of a material to block holes from the HTL going directly into the ETL 164 and rather induces the holes to stay within the EML where they can combine with electrons and, thus, emit light.

For this purpose, the ETL1 164a and the ETL2 164b should be made of a material having an appropriate energy level, and this will be described with reference to FIG. 3. For convenience of description, a highest occupied molecular orbital (HOMO) energy level used in an organic material and a valence band (VB) energy level used in an inorganic material may be used interchangeably. In addition, a lowest unoccupied molecular orbital (LUMO) energy level used in an organic material and a conduction band (CB) energy level used in an inorganic material may be used interchangeably. When any emissive layer includes both inorganic and organic materials, the terms "HOMO" and "LUMO" are representatively used to represent an energy level of a material constituting the emissive layer. In an example, a HOMO energy level (HOMO$_{EML}$) of the EML 150 is intended to include a valence band energy level (VB$_{EM}$L) of the EML 150. Similarly, a LUMO energy level (LUMO$_{EML}$) of the EML 150 is intended to include conduction band energy (CB$_{EML}$) of the EML 150.

As schematically shown in FIG. 3, a HOMO energy level (HOMO$_{EML1}$) of the organic material constituting the ETL1 164a may not be significantly different from a HOMO energy level (HOMO$_{EML}$) of the light-emitting material constituting the EML 150. In an exemplary embodiment, the HOMO energy level (HOMO$_{ETL1}$) of the organic material constituting the ETL1 164a and the HOMO energy level (HOMO$_{EML}$) of the light-emitting material constituting the EML 150 satisfy a condition of Expression (1) below:

$$-0.5 \text{ eV} \leq \text{HOMO}_{ETL1} - \text{HOMO}_{EML} \leq 1.0 \text{ eV} \qquad (1).$$

In an example, inorganic light-emitting materials such as quantum dots or quantum rods having a HOMO energy level (HOMO$_{EML}$) of about −6.6 eV may be used as the light-emitting material of the EML 150. In this case, the organic material constituting the ETL1 164a may have a HOMO energy level (HOMO$_{ETL1}$) of −5.5 eV to −6.7 eV, but the present disclosure is not limited thereto.

However, a valence band energy level (VB$_{ETL2}$) corresponding to a HOMO energy level of the inorganic material constituting the ETL2 164b is much deeper than the HOMO energy level (HOMO$_{EML}$) of the light-emitting material constituting the EML 150.

Conventionally, when an ETL made solely of an organic material is used, the difference ΔG$_H$ (see FIG. 1) between the HOMO energy level of an ETL and the HOMO energy level of an EML is very small, resulting in a problem like hole leakages. That is, the holes injected into the EML can be leaked into the ETL made of an organic material and accordingly not being combined in the EML with electrons.

In the present disclosure, the difference ΔG'$_H$ between the valence band energy level (VB$_{ETL2}$) corresponding to the HOMO energy level of the inorganic material constituting the ETL2 164b and the HOMO energy level (HOMO$_{EML}$) of the light-emitting material constituting the EML 150 is much greater than the difference ΔG$_H$ (see FIG. 1) between the HOMO energy level of the ETL 164 and the HOMO energy level of the EML 150 (that is, ΔG'$_H$>ΔG$_H$). Accordingly, holes injected into the EML 150 from the first electrode 110 may be prevented from being leaked into the ETL2 164b having a very deep valence band energy level (VB$_{ETL2}$).

In an exemplary embodiment, in the LED 100, the valence band energy level (VB$_{ETL2}$) of the inorganic material constituting the ETL2 164b and the HOMO energy level (HOMO$_{EML}$) of the light-emitting material constituting the EML 150 satisfy a condition of Expression (2) below:

$$-1.5\ eV \leq VB_{ETL2} - HOMO_{EML} \leq -0.7\ eV \quad (2).$$

In an exemplary embodiment, the inorganic material constituting the ETL2 164b may have a valence band energy level (VB$_{ETL2}$) of −7.3 eV to −8.5 eV, but the present disclosure is not limited thereto.

Electrons generated in the second electrode 120 pass through the ETL2 164b and the ETL1 164a and are injected into the EML 150. When only an ETL made of an organic material is used, due to a high LUMO energy level of the organic material having electron transport properties, the difference ΔG$_{L1}$ (see FIG. 1) between the conduction band energy level of a second electrode and the LUMO energy level of an organic ETL may be very great, resulting in a generation of an energy barrier.

On the other hand, in the present disclosure, the ETL2 164b made of an inorganic material is formed adjacent to the second electrode 120. The ETL2 164b, which is made of an inorganic material having a conduction band energy level (CB$_{ETL2}$) deeper than a LUMO energy level of an organic material, is used. Therefore, a difference Δ G'$_{L1}$ between the conduction band energy level (CB$_{ETL2}$) of the ETL2 164b corresponding to a LUMO energy of an organic material and the conduction band energy level of the second electrode 120 is much smaller than the difference ΔG$_{L1}$ (see FIG. 1) between a LUMO energy level of the ETL including only the organic material and the conduction band energy level of the second electrode 120 (ΔG'$_{L1}$<ΔG$_{L1}$).

In other words, the ETL2 164b made of an inorganic material having a relatively low conduction band energy level may be used instead of an ETL made of an organic material having a high LUMO energy level, thereby removing the energy barrier between an electron injection electrode (i.e., the second electrode 120) and the ETL 162. As the energy barrier may be removed between the second electrode 120 and the ETL 162, electrons may be rapidly injected into the EML 150, and thus, electrons and holes may be injected into the EML 150 in a balanced manner. Since holes and electrons are injected into the EML 150 in a balanced manner, electrons that disappear without forming excitons are considerably reduced, thereby improving the luminous efficiency of an LED.

Incidentally, when only an ETL made of an inorganic material is used, an energy barrier between a second electrode and an ETL may be removed to lower a driving voltage of an LED. However, a difference between a conduction band energy level (i.e., a LUMO energy level) of the ETL made of the inorganic material and a LUMO energy level of an EML is excessively decreased. That is, when only the ETL made of the inorganic material is used, electrons injected into the ETL made of the inorganic material are injected into the EML in a state in which the electrons do not have a sufficiently high LUMO energy level. Accordingly, the number of effective electrons injected into the EML from the ETL made of only the inorganic material is reduced, and thus, current leakage occurs which decreases the luminous efficiency of an LED.

Therefore, in the present disclosure, the ETL1 164a made of an organic material having a LUMO energy level higher than the conduction band energy level (i.e., a LUMO energy level) of an inorganic material constituting the ETL2 is formed adjacent to the EML 150. Electrons generated in the second electrode 120 sequentially move to the ETL2 164b and the ETL1 164a, which have a high LUMO energy level. Since electrons are injected into the EML 150 from the ETL1 164a having a sufficiently high LUMO energy level, the number of effective electrons injected into the EML 150 is not reduced, and the luminous efficiency of an LED is not decreased due to current leakage. Accordingly, the luminous efficiency of the LED is significantly improved.

Figure 1:
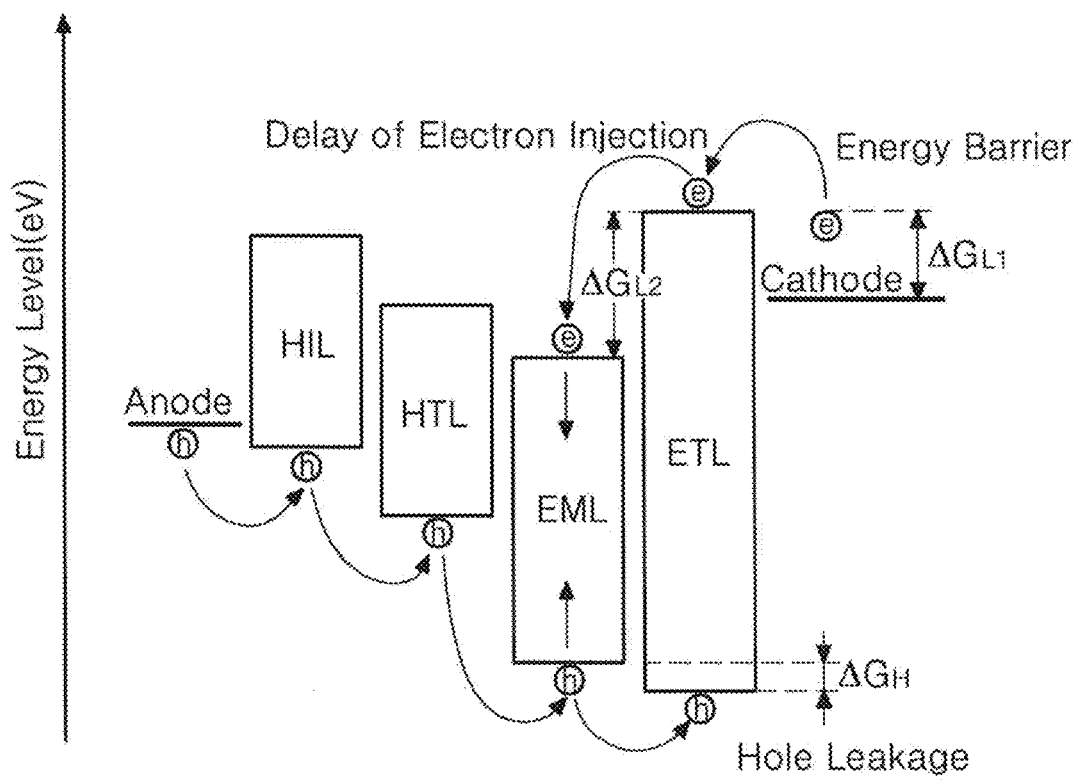
FIG. 1 is a schematic diagram illustrating bandgap energies of electrodes constituting a conventional light-emitting diode (LED) and materials constituting a emissive layer disposed between the electrodes.

As shown in FIG. 1, the difference ΔG$_{L2}$, between a LUMO energy level of the electron transport layer ETL and a LUMO energy level of the emitting material layer EML, is excessively high and accordingly the injection of electrons into the EML 150 may be delayed. In the present disclosure, on the other hand, the ETL1 164a is made of an organic material which is formed between the EML 150 and the ETL2 164b made of an inorganic material. This structure substantially decreases the difference ΔG$_{L2}$ in the conventional OLED structure to ΔG'$_{L2}$ (ΔG'$_{L2}$<ΔG$_{L2}$; see FIG. 3). In one embodiment, the difference ΔG'$_{L2}$ between a LUMO energy level (LUMO$_{ETL1}$) of the organic material constituting the ETL1 164a and the LUMO energy level (LUMO$_{EML}$) of the light-emitting material constituting the EML 150 may satisfy a condition of Expression (3) below:

$$0.5\ eV \leq LUMO_{ETL1} - LUMO_{EML} \leq 2.8\ eV \quad (3).$$

In an example, a LUMO energy level (LUMO$_{EML}$) of light-emitting materials such as quantum dots constituting the EML 150 is in a range of about −4.8 eV to about −4.0 eV. In this case, the organic material constituting the ETL1 164a may have a LUMO energy level (LUMO$_{ETL1}$) of −3.5 eV to −2.0 eV.

According to an exemplary embodiment, the ETL1 164a may be made of organic material satisfying energy level conditions of Expressions (1) and (3) described above.

In an example, the organic material constituting the ETL1 164a may be selected from the group including 1,3,5-tri(m-pyridin-3-yl-phenyl)benzene (TmPyPB) having a HOMO of −6.7 eV and a LUMO of −2.8 eV, bathocuproine (2,9-dimethyl-4,7-diphenyl-1,10-phenanthroline) (BCP) having a HOMO of −6.5 eV and a LUMO of −3.0 eV, bathophenathroline (4,7-diphenyl-1,10-phenanthroline) (Bphen) having a HOMO of −6.4 eV and a LUMO of −2.9 eV, 1,3-bis (3,5-dipyrid-3-yl-phenyl)benzene (B3yPyPB) having a HOMO of −6.7 eV and a LUMO of −2.6 eV, diphenyl bis(4-(pyridine-3-yl)phenyl)silane (DPPS) having a HOMO of −6.5 eV and a LUMO of −2.5 eV, 2,2',2''-(1,3,5-benzinetriyl)-tris(1-phenyl-1-H-benzimidazole) (TPBi) having a HOMO of −6.2 eV and a LUMO of −2.8 eV, tris(8-hydroxyquinoline)aluminum) (Alq$_3$) having a HOMO of −5.7 eV and a LUMO of −2.9 eV, bis(8-hydroxy-2-methylquinoline)-(4-phenylphenoxy)aluminum (Balq) having a HOMO of −5.9 eV and a LUMO of −2.9 eV, 2-[4-(9,10-di-2-naphthalenyl-2-anthracenyl)phenyl]-1-phenyl-1H-benzimidazole having a HOMO of −6.0 eV and a LUMO of −2.8 eV, 2-(4-tert-butylphenyl)-5-(4-biphenyl)-1,3,4-oxadiazole (PBD) having a HOMO of −6.1 eV and a LUMO of −2.6 eV, 1,3-bis[(4-tert-butylphenyl)-1,3,4-oxadiazoyl]phenylene (OXD-7) having a HOMO of −6.3 eV and a LUMO of −2.7 eV, 1,3,5-tris[(4'-tert-butylphenyl)-1,3,4-oxadiazoyl]benzene (OXD) having a HOMO of −6.6 eV and a LUMO of −3.2 eV, poly[(9,9-bis(3'((N,N-dimethyl)-N-ethylammonium)-propyl)-2,7-fluorene)-alt-2,7-(9,9-dioctylfluorene)] dibromide (PFNBr) having a HOMO of −5.7 eV and a LUMO of −2.2 eV, poly(9,9-bis(6-trimethyl ammoniumiodide)-hexylfluorene-2,7-diyl-alt-(benzo[2,1,3]thiadiazol-4, 7-diyl)) (PFNIBT), poly[9,9-bis(6'-(diethanolamino)hexyl) fluorene] PFN-OH), poly[9,9-(bis(4'-(6''-diethanolamino) hexyloxy)phenyl)fluorene] (PPFN-OH), poly[(9,9-bis(6'-(N,N-dimethylamino)hexyl)phenyl)fluorene] (FPO) having a HOMO of −5.8 eV and a LUMO of −2.4 eV, poly[(9,9-bis(6'-(N,N-trimethylaminobromide)hexyl)phenyl)fluorene] (FPO-Br) having a HOMO of −5.6 eV, poly[(9,9-bis(6'-(N, N-trimethylaminochloride)hexyl)phenyl)fluorene] (FPO-Cl) having a HOMO of −5.8 eV, and combinations thereof. However, the present disclosure is not limited thereto.

The ETL2 164b may be made of an inorganic material having a very deep valence band energy level as presented in Expression (2) described above. It may be desirable that the inorganic material includes metal oxide particles having high electron mobility properties. In an example, the inorganic material constituting the ETL2 164b includes metal oxides including zinc oxide (ZnO), zinc magnesium oxide (ZnMgO), titanium dioxide ($TiO_2$), zirconium oxide ($ZrO_2$), tin oxide (SnO), tin dioxide ($SnO_2$), tungsten oxide ($WO_3$), tantalum oxide ($Ta_2O_3$), hafnium oxide ($HfO_3$), aluminum oxide ($Al_2O_3$), zirconium silicon oxide ($ZrSiO_4$), barium titanium oxide ($BaTiO_3$), barium zirconium oxide ($BaZrO_3$), and combinations thereof, but the present disclosure is not limited thereto.

If necessary, metal oxide particles constituting the ETL2 164b may not be doped or doped with Al, Mg, In, Li, Ga, Cd, Cs, Cu, or the like.

In an example, the metal oxide particles constituting the ETL2 164b may be prepared by using 1) a co-precipitation method in which various different ions are simultaneously precipitated in an aqueous solution or a non-aqueous solution, 2) a sol-gel method, 3) a hydrothermal synthesis method in which the temperature and pressure of a homogeneous aqueous solution or a suspension are raised, or the like.

For example, in the co-precipitation method, insoluble hydroxides, carbonates, oxalates, or the like are finely mixed and dispersed with metal oxide particles. In an example of the co-precipitation method, a metal salt such as a metal alkoxide (for example, isopropoxide, butoxide, or propoxide of Ti/Zr) may be mixed in an alcohol solution to prepare metal oxide particles through hydrolysis and pyrolysis due to a reaction between the metal alkoxide and water.

The sol-gel method is similar to the co-precipitation method, but a hydrolysis reaction slowly proceeds. A gel obtained through hydrolysis and a condensation reaction is heat-treated to remove organic components and to prepare metal oxide particles. The sol-gel method may be classified as a colloid method including forming a raw material solution, i.e., a sol through dispersion of colloid particles in a solution, and allowing the sol to gelate through destabilization of a sol state, and a method including forming a sol using a metal organic compound such as an alkoxide, allowing the sol to gelate through hydrolysis and a concentration reaction, and then, performing heat treatment to manufacture metal oxide particles.

Similar to the first charge transfer layer 140, the second charge transfer layer 160 is illustrated in FIG. 2 as including two layers of the EIL 162 and the ETL 164. However, the second charge transfer layer 160 may include only a single layer of the ETL 164. In addition, the second charge transfer layer 160 may be formed to include a single layer of the ETL 164 in which cesium carbonate is blended with an electron transport material including the above-described inorganic material.

The second charge transfer layer 160 including the EIL 162 and/or the ETL 164 may be formed by using a solution process such as spin coating, drop coating, dip coating, spray coating, roll coating, flow coating, a casting process, screen printing, and inkjet printing alone or in combination. In an example, each of the EIL 162 and the ETL 164 may be stacked to a thickness of about 10 nm to about 200 nm, preferably, a thickness of about 10 nm to about 100 nm.

For example, when the HTL 144 constituting the first charge transfer layer 140 is made of an organic material and the second charge transfer layer 160 includes a hybrid charge transport layer (CTL) made of an inorganic material, the emission properties of the LED 100 can be improved.

When holes pass through the EML 150 and move to the second electrode 120 or electrons pass through the EML 150 and move to the first electrode 110, a lifespan and efficiency of a device can be reduced. In order to prevent this, the LED 100 according to the first exemplary embodiment of the present disclosure may include at least one exciton blocking layer disposed adjacent to the EML 150.

For example, the LED 100 according to the first exemplary embodiment of the present disclosure may include an electron blocking layer (EBL) configured to control and prevent movement of electrons between the HTL 144 and the EML 150.

In an example, the electron blocking layer may be made of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, tri-p-tolylamine, 1,1-bis[4-[N,N-di(p-tolyl)amino]phenyl]cyclohexane (TAPC), m-MTDATA, 1,3-bis(N-carbazolyl) benzene (mCP), 3,3'-bis (N-carbazolyl)-1,1'-biphenyl (mCBP), Poly-TPD, copper phthalocyanine (CuPc), DNTPD, 1,3,5-tris[4-(diphenylamino)phenyl]benzene (TDAPB), and/or the like.

In addition, a hole blocking layer (HBL) may be disposed as a second exciton blocking layer between the EML 150 and the ETL 164, thereby preventing the movement of holes between the EML 150 and the ETL 164. In an exemplary embodiment, a material of the hole blocking layer may include a derivative of oxadiazole, triazole, phenanthroline, benzoxazole, benzothiazole, benzimidazole, or triazine.

For example, the hole blocking layer may be made of at least one selected from 2,9-dimethyl-4,7-diphenyl-1,10-phenanthroline (BCP), BAlq, $Alq_3$, PBD, spiro-PBD, 8-hydroxy-quinolinato lithium (LiQ), and/or like, which have a HOMO energy level deeper than that of a material used in the EML 150.

As described above, according to the first exemplary embodiment of the present disclosure, the ETL 164 disposed between the EML 150 and the second electrode 120 includes the ETL1 164a made of the organic material and the ETL2 164b made of the inorganic material. Since the ETL2 164b is made of the inorganic material having the very deep valence band energy level, holes injected into the EML 150 are blocked in the ETL2 164b, thereby preventing the leakage of holes to the second electrode 120.

An energy band gap $\Delta G'_{L1}$ between the ETL2 164b and the second electrode 120 is small, and thus, there is no energy barrier related to electron injection. Since the ETL1 164a made of the organic material has a relatively high LUMO energy level in comparison to the ETL2 164b made of the inorganic material, electrons having a sufficiently high energy level are injected into the EML 150 from the ETL1 164a. The number of effective electrons injected into the EML 150 is not reduced, and luminous efficiency of the LED 100 is not decreased due to current leakage.

An LED having a normal structure has been described with reference to FIGS. 2 and 3, the normal structure indicating a structure in which a hole transfer layer is disposed between a first electrode having a relatively low work function value and an EML and an electron transfer layer is disposed between a second electrode having a relatively high work function and the EML. An LED may have an inverted structure rather than a normal structure, and this will be described.

Figure 4:
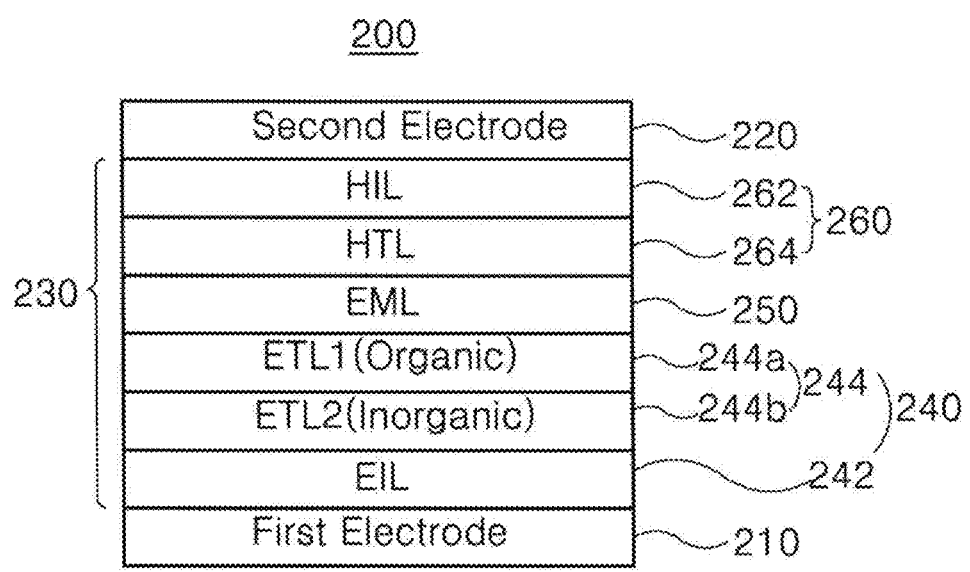
FIG. 4 is a schematic cross-sectional view illustrating an LED having an inverted structure according to a second exemplary embodiment of the present disclosure.
Figure 5:
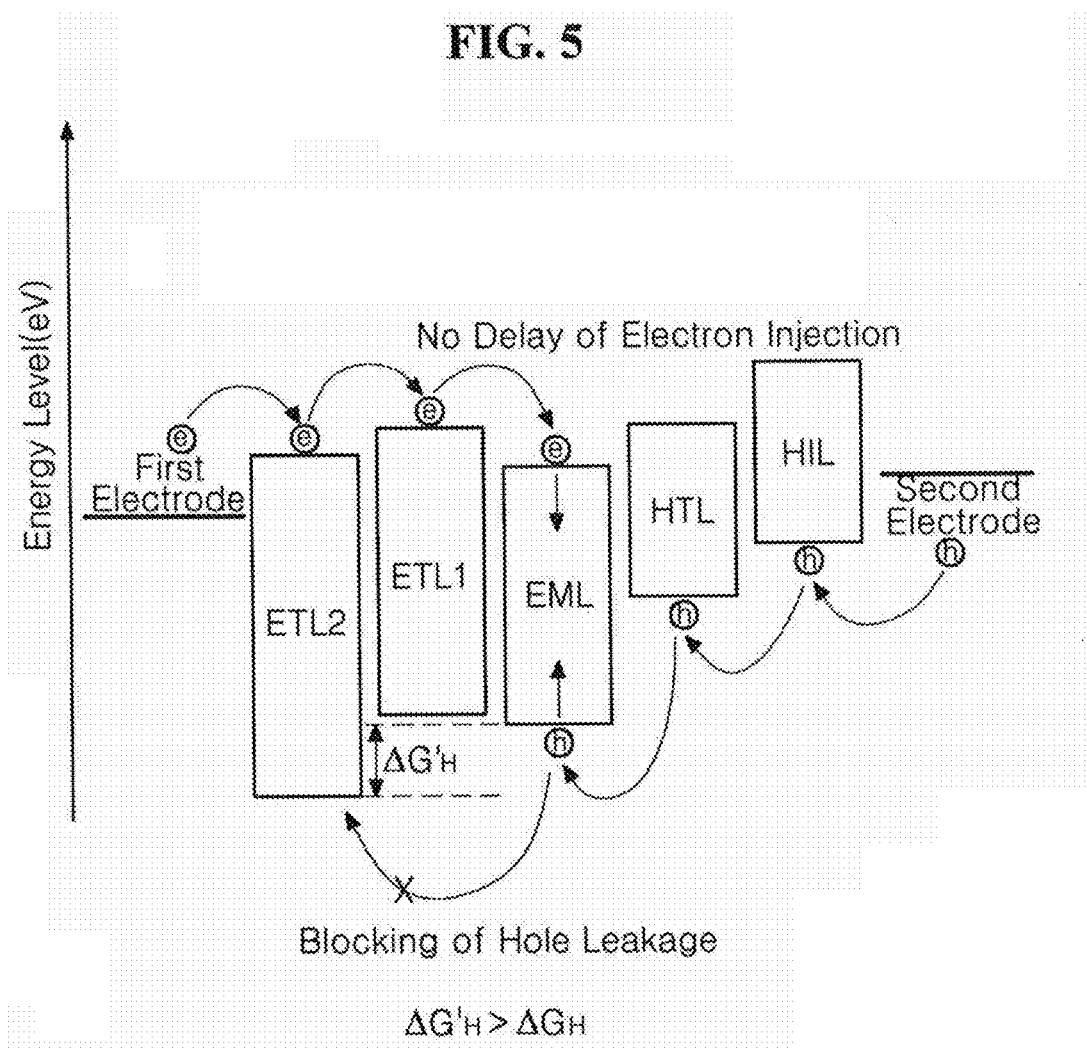
FIG. 5 is a schematic diagram illustrating bandgap energies of electrodes constituting the LED according to the second exemplary embodiment of the present disclosure and materials constituting a emissive layer.

FIG. 4 is a schematic cross-sectional view illustrating an LED 200 having an inverted structure according to a second exemplary embodiment of the present disclosure, and FIG. 5 is a schematic diagram illustrating bandgap energies of electrodes constituting the LED 200 according to the second exemplary embodiment of the present disclosure and materials constituting an emissive layer 230.

As shown FIG. 4, the LED 200 according to the second exemplary embodiment of the present disclosure includes a first electrode 210, a second electrode 220 facing the first electrode 210, and the emissive layer 230 including an EML 250 disposed between the first electrode 210 and the second electrode 220. The emissive layer 230 may further include a first charge transfer layer 240 disposed between the first electrode 210 and the EML 250 and a second charge transfer layer 260 disposed between the second electrode 220 and the EML 250.

In the second exemplary embodiment of the present disclosure, the first electrode 210 may be a cathode such as an electron injection electrode. In an example, the first electrode 210 may be made of a doped or undoped metal oxide such as ITO, IZO, ITZO, ICO, $SnO_2$, $In_2O_3$, Cd:ZnO, F:$SnO_2$, In:$SnO_2$, Ga:$SnO_2$, or AZO, or may be made of a material including nickel (Ni), platinum (Pt), gold (Au), silver (Ag), iridium (Ir), or a carbon nanotube in addition to the above-described metal oxides.

In the second exemplary embodiment of the present disclosure, the second electrode 220 may be an anode such as a hole injection electrode. In an example, the second electrode 220 may be made of at least one selected from Ca, Ba, Ca/Al, LiF/Ca, LiF/Al, $BaF_2$/Al, CsF/Al, $CaCO_3$/Al, $BaF_2$/Ca/Al, Al, Mg, Au:Mg, and Ag:Mg. For example, each of the first electrode 210 and the second electrode 220 may be stacked to have a thickness of about 30 nm to about 300 nm.

In the second exemplary embodiment of the present disclosure, the first charge transfer layer 240 may be an electron transfer layer configured to supply electrons to the EML 250. In an exemplary embodiment, the first charge transfer layer 240 includes an EIL 242 disposed adjacent to the first electrode 210 between the first electrode 210 and the EML 250 and an ETL 244 disposed adjacent to the EML 250 between the first electrode 210 and the EML 250.

The EIL 242 may be made of a material in which fluorine is doped into or bonded to a metal such as Al, Cd, Cs, Cu, Ga, Ge, In, or Li, or may be made of metal oxide such as $TiO_2$, ZnO, ZrO, $SnO_2$, $WO_3$, or $Ta_2O_3$, which is doped or not doped with Al, Mg, In, Li, Ga, Cd, Cs, Cu, or the like.

The ETL 244 includes an ETL1 244a disposed adjacent to the EML 250 between the first electrode 210 and the EML 250 and an ETL2 244b disposed between the ETL1 244a and the first electrode 210, for example, between the ETL1 244a and the EIL 242. In this case, the ETL1 244a may be made of an organic material, and the ETL2 244b may be made of an inorganic material.

In an exemplary embodiment, the ETL1 244a may be made of organic material satisfying energy level conditions of Expressions (1) and (3) described above. For example, the ETL1 244a may include monomolecular materials such as TmPyPB, BCP, Bphen, B3yPyPB, DPPS, TPBi, $Alq_3$, BAlq, 2-[4-(9,10-di-2-naphthalenyl-2-anthracenyl)phenyl]-1-phenyl-1H-benzimidazole, PBD, OXD-7, and/or OXD; and/or polymer materials such as PFNBr, PFNIBT, PFN-OH, PPFN-OH, FPO, FPO-Br, and/or FPO-Cl.

The ETL2 244b may be made of an inorganic material having a very deep valence band energy level as presented in Expression (2) described above. In an example, the ETL2 244b may be made of one selected from metal oxides including ZnO, ZnMgO, $TiO_2$, MgO, $ZrO_2$, SnO, $SnO_2$, $WO_3$, $Ta_2O_3$, $HfO_3$, $Al_2O_3$, $ZrSiO_4$, $BaTiO_3$, $BaZrO_3$, and combinations thereof.

The first charge transfer layer 240 may include only a single layer of the ETL 244. In addition, the first charge transfer layer 240 may be formed to include a single layer of the ETL 244 in which cesium carbonate is blended with an electron transport material including the above-described inorganic material. In an example, each of the EIL 242 and the ETL 244 may be stacked to have a thickness of about 10 nm to about 200 nm, preferably, a thickness of about 10 nm to about 100 nm.

The EML 250 may be made of inorganic luminescent particles or an organic light-emitting material. The inorganic luminescent particles may be inorganic luminescent nanoparticles such as quantum dots or quantum rods. Quantum dots or quantum rods may have a single structure or a heterologous structure of a core/shell.

Quantum dots or quantum rods may be semiconductor nanocrystals or metal oxide particles having a quantum confinement effect. For example, the quantum dots or quantum rods may include a group II-VI, group III-V, group IV-VI, or group I-III-VI compound semiconductor nanocrystals. More specifically, the core and/or shell constituting the quantum dots or quantum rods may be group II-VI compound semiconductor nanocrystals such as CdS, CdSe, CdTe, ZnS, ZnSe, ZnTe, HgS, HgTe and/or combinations thereof; group III-V compound semiconductor nanocrystals such as GaP, GaAs, GaSb, InP, InAs, InSb, and/or combinations thereof; group IV-VI compound semiconductor nanocrystals such as PbS, PbSe, PbTe, and/or combinations thereof; group compound semiconductor nanocrystals such as $AgGaS_2$, $AgGaSe_2$, $AgGaTe_2$, $CuInS_2$, $CuInSe_2$, $CuGaS_2$, $CuGaSe_2$, and/or combinations thereof; metal oxide nanoparticles such as ZnO, $TiO_2$, and/or a combination thereof; and core-shell structured nanocrystals such as CdSe/ZnSe, CdSe/ZnS, CdS/ZnSe, CdS/ZnS, ZnSe/ZnS, InP/ZnS, ZnO/MgO, and/or any combination thereof. Semiconductor nanoparticles may be undoped or doped with a rare earth element such as Eu, Er, Tb, Tm, Dy, or any combination thereof, or may be doped with a transition metal element such as Mn, Cu, Ag, or any combination thereof.

When the EML 250 is made of inorganic luminescent particles such as quantum dots or quantum rods, the EML 250 is formed by applying a solution containing quantum dots or quantum rods in a solvent on the first charge transfer layer 240, for example, the ETL 244 through a process using the solution, and then, volatilizing the solvent.

When the EML 250 is made of an organic light-emitting material, the EML 250 may be made of an organic light-emitting material emitting red light, green light, and/or blue light and may include a fluorescent material or a phosphorescent material. In addition, the organic light-emitting material constituting the EML 250 may include a host and a dopant. When the organic light-emitting material is configured as a host-dopant system, a dopant may be doped at a ratio of about 1-50 wt %, preferably, about 1-30 wt % with respect to the weight of a host, but the present disclosure is not limited thereto.

When the EML 250 is made of the organic light-emitting material, the EML 250 may be formed using a vacuum deposition process including a vacuum vapor deposition process and a sputtering process, and a solution process such as one from among a spin coating method, a drop coating method, a dip coating method, a spray coating method, a roll coating method, a flow coating method, a casting process, a screen printing method, and an inkjet printing method or combinations thereof.

In the second exemplary embodiment of the present disclosure, the second charge transfer layer 260 may be a hole transfer layer configured to supply holes to the EML 250. In an exemplary embodiment, the second charge transfer layer 260 includes an HIL 262 disposed adjacent to the second electrode 220 between the second electrode 220 and the EML 250 and an HTL 264 disposed adjacent to the EML 250 between the second electrode 220 and the EML 250.

The HIL 262 may be made of a material selected from the group including PEDOT:PSS, TDATA doped with F4-TCNQ, e.g., p-doped phthalocyanine such as ZnPc doped with F4-TCNQ, α-NPD doped with F4-TCNQ, HAT-CN, and combinations thereof, but the present disclosure is not limited thereto. In an example, a dopant such as F4-TCNQ may be doped at a ratio of about 1 wt % to about 30 wt % with respect to the weight of a host. The HIL 262 may be omitted according to the structure and shape of the LED 200.

The HTL 264 may be made of an inorganic material or an organic material. In an example, when the HTL 264 is made of the organic material, the HTL 264 may be made of an organic material selected from the group including arylamines such as CBP, α-NPD, TPD, spiro-TPD, DNTPD, TCTA, m-MTDATA, TFB, and poly-TPD; polyaniline; polypyrrole; poly(p-phenylenevinylene (PPV)) and a derivative thereof such as MEH-PPV or MOMO-PPV; copper phthalocyanine; an aromatic tertiary amine or polynuclear aromatic tertiary amine; a 4,4'-bis(p-carbazolyl)-1,1'-biphenyl compound; N,N,N',N'-tetraarylbenzidine; PEDOT:PSS and a derivative thereof; poly-N-vinylcarbazole and a derivative thereof; polymethacrylate and a derivative thereof; poly(9,9-octylfluorene) and a derivative thereof; poly(spiro-fluorene) and a derivative thereof; NPB; Spiro-NPB; and combinations thereof.

When the HTL 264 is made of the inorganic material, the HTL 264 may be made of an inorganic material selected from the group including metal oxides such as NiO, $MoO_3$, $Cr_2O_3$, $Bi_2O_3$, or p-type ZnO; a non-oxide equivalent such as copper thiocyanate (CuSCN), $Mo_2S$, or p-type GaN; and combinations thereof.

The second charge transfer layer 260 may include a single layer. For example, the HIL 262 may be omitted, and the second charge transfer layer 260 may be include only the HTL 264 and may be formed by doping a hole injection material (for example, PEDOT:PSS) into the above-described hole transport organic material. Each of the HIL 262 and the HTL 264 may have a thickness of about 10 nm to about 200 nm, preferably, a thickness of about 10 nm to about 100 nm, but the present disclosure is not limited thereto.

Similar to the first exemplary embodiment, the LED 200 according to the second exemplary embodiment of the present disclosure may include at least one exciton blocking layer disposed adjacent to the EML 250. For example, the LED 200 may further include an electron blocking layer disposed between the EML 250 and the HTL 264 and configured to control and prevent the movement of electrons; and/or a hole blocking layer disposed between the ETL 244 and the EML 250 and configured to control and prevent the movement of holes.

As described above, according to the second exemplary embodiment of the present disclosure, the ETL 244 disposed between the first electrode 210 and the EML 250 includes the ETL1 244a made of the organic material and the ETL2 244b made of the inorganic material. The ETL2 164b is made of an inorganic material having a very deep valence band energy level. A difference $\Delta G'_H$ between a HOMO energy level of the EML 250 and a valence band energy level of the ETL2 244b is much greater than a difference $\Delta G_H$ (see FIG. 1) between the HOMO energy level of the EML 250 and a HOMO energy level of an ETL made of an organic material ($\Delta G'_H > \Delta G_H$). Therefore, holes injected into the EML 250 are blocked in the ETL2 244b, thereby preventing the leakage of holes to the first electrode 210.

The ETL1 244a made of the organic material may have a relatively high LUMO energy level in comparison to the ETL2 244b made of the inorganic material. In addition, a material, of which a LUMO energy level is not excessively high in comparison to a LUMO energy level of a light-emitting material used in the EML 250, is used as the organic material constituting the ETL1 244a. Therefore, electrons having a sufficiently high energy level may be rapidly injected into the EML 250 from the ETL1 244a. Holes and electrons may be injected into the EML 250 in a balanced manner, the number of effective electrons injected into the EML 250 is not reduced, and luminous efficiency of the LED 200 is not decreased due to current leakage.

Figure 6:
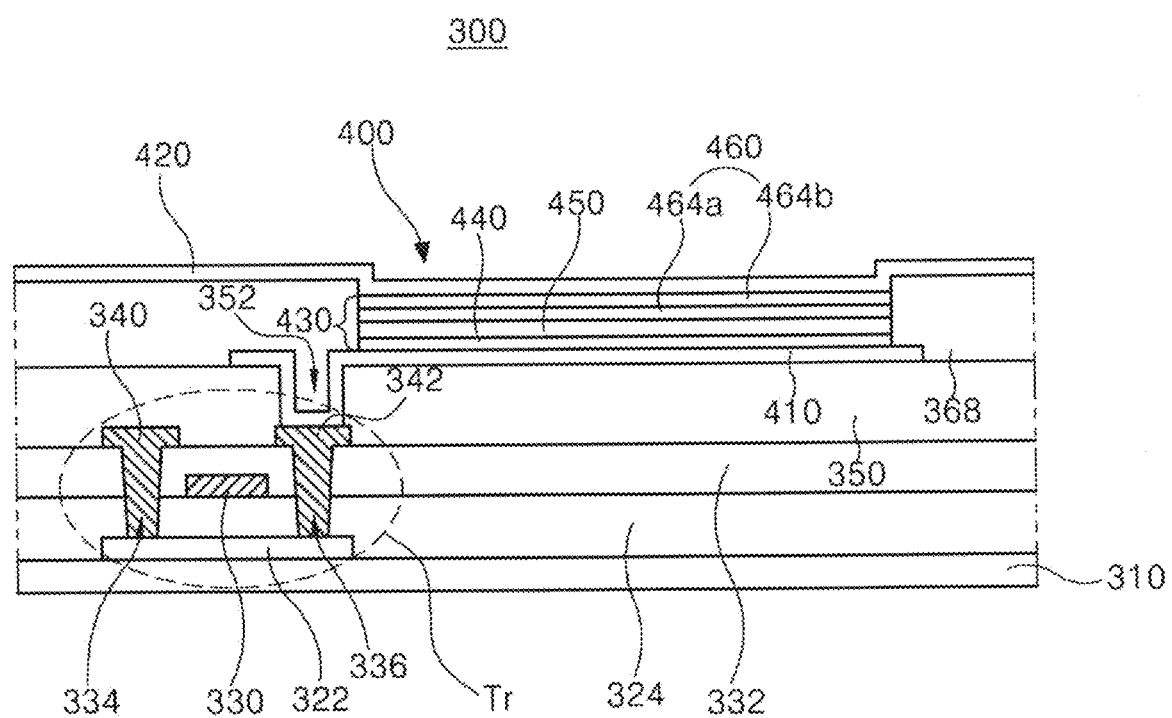
FIG. 6 is a schematic cross-sectional view illustrating an LED display device as an example of a light-emitting device to which an LED according to an exemplary embodiment of the present disclosure is applied.

Accordingly, according to the present disclosure, an LED, which includes an ETL having an organic-inorganic hybrid structure formed by sequentially stacking an organic ETL and an inorganic ETL, may be applied to a light-emitting device such as a lighting device or a display device. In an example, a light-emitting device, which includes an LED in which two types of inorganic particles having different average particle sizes according to the present disclosure are used in an ETL, will be described. FIG. 6 is a schematic cross-sectional view illustrating a light-emitting display device according to an exemplary embodiment of the present disclosure.

As shown in FIG. 6, the light-emitting display device 300 includes a substrate 310, a driving thin film transistor Tr, that is, a driving element disposed on the substrate 310, and an LED 400 connected to the driving thin film transistor Tr.

A semiconductor layer 322 made of an oxide semiconductor material or polycrystalline silicon is formed on the substrate 310. When the semiconductor layer 322 is made of an oxide semiconductor material, a light shielding pattern (not shown) may be formed on a lower portion of the semiconductor layer 322. The light shielding pattern prevents light from being incident on the semiconductor layer 322 and thus prevents the semiconductor layer 322 from being degraded by light. Alternatively, the semiconductor layer 322 may be made of polycrystalline silicon. In this case, impurities may be doped into both edges of the semiconductor layer 322.

A gate insulating film 324 made of an insulating material is formed on an upper portion of the semiconductor layer 322. The gate insulating film 324 may be made of an inorganic insulating material such as silicon oxide ($SiO_2$) or silicon nitride ($SiN_x$). A gate electrode 330 made of a conductive material such as a metal is formed on an upper portion of the gate insulating film 324 so as to correspond to a center of the semiconductor layer 322.

An interlayer insulating film 332 made of an insulating material is formed on an upper portion of the gate electrode 330. The interlayer insulating film 332 may be made of an inorganic insulating material such as silicon oxide ($SiO_2$) or silicon nitride ($SiN_x$), or may be made of an organic insulating material such as benzocyclobutene or photo-acryl.

The interlayer insulating film 332 has first and second semiconductor layer contact holes 334 and 336 configured to expose both sides of the semiconductor layer 322 or either side of the channel. The first and second semiconductor layer contact holes 334 and 336 are spaced apart from the gate electrode 330 at both sides of the gate electrode 330. A source electrode 340 and a drain electrode 342 made of a conductive material such as a metal are formed on the interlayer insulating film 332.

The source electrode 340 and the drain electrode 342 are spaced apart with respect to the center of the gate electrode 330 and are in contact with both sides of the semiconductor layer 322 through the first and second semiconductor layer contact holes 334 and 336, respectively.

The semiconductor layer 322, the gate electrode 330, the source electrode 340, and the drain electrode 342 constitute the driving element, i.e., the driving thin film transistor Tr.

FIG. 6 shows a structural example in an integrated circuit of the OLED or QLED being formed according to the various embodiments disclosed in FIGS. 2-5. In FIG. 6, the driving thin film transistor Tr has a coplanar structure in which the gate electrode 330, the source electrode 340, and the drain electrode 342 are disposed on the upper portion of the semiconductor layer 322. Alternatively, the driving thin film transistor Tr may have an inverted staggered structure in which a gate electrode is disposed on a lower portion of a semiconductor layer and a source electrode and a drain electrode are disposed on an upper portion of the semiconductor layer. In this case, the semiconductor layer may be made of amorphous silicon.

Although not shown, a gate line and a data line cross over each other adjacent to a pixel region, and a switching element connected to the gate line and the data line is further formed. The switching element is connected to the driving element, i.e., the driving thin film transistor Tr. In addition, a power line is formed to be spaced apart from and parallel to the gate line or the data line, and a storage capacitor is further formed to constantly maintain a voltage of the gate electrode of the driving element, i.e., the driving thin film transistor Tr during one frame.

A passivation layer 350 is formed to cover the driving thin film transistor Tr and has a drain contact hole 352 configured to expose the drain electrode 342 of the driving thin film transistor Tr. The passivation layer 350 may be made of an inorganic insulating material such as silicon oxide ($SiO_2$) or silicon nitride (SiNx), or may be made of an organic insulating material such as benzocyclobutene or photo-acryl.

The LED 400 is disposed on the passivation layer 350. Specifically, a first electrode 410 connected to the drain electrode 342 of the driving thin film transistor Tr through the drain contact hole 352 is formed on the passivation layer 350 so as to be divided for each pixel region. The first electrode 410 may be an anode or a cathode and may be made of a conductive material having a relatively large work function value. For example, the first electrode 410 may be made of a doped or undoped metal oxide such as ITO, IZO, ITZO, ICO, $SnO_2$, $In_2O_3$, Cd:ZnO, $F:SnO_2$, $In:SnZO_2$, $Ga:SnO_2$, or AZO, or may be made of a metal material including nickel (Ni), platinum (Pt), gold (Au), silver (Ag), iridium (Ir), or a carbon nanotube in addition to the above-described metal oxides. The first electrode 410 corresponds to the first electrode 110 or 210 as described with respect to FIGS. 2 and 3 and, thus, can be made of the materials described with respect to those figures and provide the described functions.

When the light-emitting display device 300 of the present disclosure is a top-emission type, a reflective electrode or a reflective layer may be further formed on a lower portion of the first electrode 410. For example, the reflective electrode or the reflective layer may be made of an aluminum-palladium-copper (APC) alloy.

In addition, a bank layer 368 covering an edge of the first electrode 410 is formed on the passivation layer 350. The bank layer 368 exposes a center of the first electrode 410 to correspond to a pixel region.

An emissive layer 430 is formed on the first electrode 410. The emissive layer 430 may include only an EML but may include a plurality of charge transfer layers so as to improve luminous efficiency. In an example, the emissive layer 430 is illustrated in FIG. 6 as including a first charge transfer layer 440, an EML 450, and a second charge transfer layer 460 which are sequentially stacked between the first electrode 410 and a second electrode 420.

For example, the first charge transfer layer 440 may be a hole transfer layer and may include an HIL 142 (see FIG. 2) and an HTL 144 (see FIG. 2), which are made of an organic material or an inorganic material. The EML 450 may be made of inorganic luminescent particles or an organic light-emitting material. Meanwhile, the second charge transfer layer 460 may be an electron transfer layer and may include an EIL 162 (see FIG. 2) and an ETL 164 (see FIG. 2).

For example, the first charge transfer layer 440 includes an ETL1 464a made of an organic material and disposed adjacent to the EML 450 and an ETL2 464b made of an inorganic material and disposed adjacent to the second electrode 420.

The second electrode 420 is formed on the upper portion of the substrate 310, on which the emissive layer 430 is formed. The second electrode 420 may be disposed on an entire surface of a display region, may be made of a conductive material having a relatively small work function value, and may be a cathode or an anode. For example, the second electrode 420 may be made of at least one selected from Ca, Ba, Ca/Al, LiF/Ca, LiF/Al, $BaF_2$/Al, CsF/Al, $CaCO_3$/Al, $BaF_2$/Ca/Al, Al, Mg, Au:Mg, and Ag:Mg.

FIG. 6 exemplarily shows the LED 400 having a first structure in which the first charge transfer layer 440 is disposed as a hole transfer layer between the first electrode 410 and the EML 450 and the second charge transfer layer 460 is disposed as an electron transfer layer between the second electrode 420 and the EML 450.

In another embodiment, an LED may be manufactured to have an inverted structure in which the first charge transfer layer 440 is disposed as an electron transfer layer between the first electrode 410 and the EML 450 and the second charge transfer layer 460 is disposed as a hole transfer layer between the second electrode 420 and the EML 450. In this case, the ETL1 464a made of the organic material and the ETL2 464b made of the inorganic material may be included in the first charge transfer layer 440 disposed between the first electrode 410 and the EML 450.

The second charge transfer layer 460 disposed between the EML 450 and the second electrode 420 has an organic-inorganic hybrid structure formed by consecutively forming the ETL1 464a made of the organic material and the ETL2 464b made of the inorganic material. Since a valence band energy level of the inorganic material constituting the ETL2 464b is much deeper than a HOMO energy level of the light-emitting material used in the EML 450, holes injected into the EML 450 are blocked in the ETL2 464b.

Since a bandgap is very small between a conduction band energy level of the second electrode 420 and a conduction band energy level of the ETL2 464b made of the inorganic material, an energy barrier related to electron injection is not present or is very low between the second electrode 420 and the ETL 460. In addition, a LUMO energy level of the ETL1 464a made of the organic material is higher than a conduction band energy level of the ETL2 464b made of the inorganic material. Electrons injected into the ETL1 464a may have an appropriate energy level and may be rapidly injected into the EML 450.

Accordingly, the number of effective electrons injected into the EML 450 may be maintained to suppress current leakage. Holes and electrons are injected into the EML 450 in a balanced manner, and thus, the probability that the holes and the electrons disappear without forming excitons is reduced. Holes and electrons do not meet at an interface adjacent to the EML 450 but can form excitons within the central region of the light-emitting material constituting the EML 450. Accordingly, luminous efficiency of the LED 400 and the light-emitting display device 300 including the same may be improved, and the LED 400 and the light-emitting display device 300 may be driven at a low voltage to reduce power consumption.

Hereinafter, the present disclosure will be described through exemplary embodiments, but is not limited to the technical idea described in the following embodiments.

Synthesis Example

Synthesis of ZnMgO Nanoparticle Dispersion

A 0.1 M solution was prepared by dissolving zinc acetate dihydrate in dimethyl sulfoxide (DMSO). Next, a 0.1 M solution was prepared by dissolving magnesium acetate tetrahydrate in dimethyl sulfoxide (DMSO). A 0.5 M solution was prepared by dissolving tetramethylammonium hydroxide pentahydrate (TMAH) in ethanol. 27 mL of the zinc acetate dihydrate solution, 3 mL of the magnesium acetate tetrahydrate solution and 10 ml of the TMAH solution were introduced into a 250-mL 2-neck reaction flask and were stirred for 4 hours. After the reaction was completed, generated ZnO particles were precipitated using ethyl acetate, and then, a solvent was removed using a centrifuge. After the ZnO particles were redispersed in ethanol, a dispersion stabilizer, i.e., 2-ethanolamine was introduced, and then, the resultant mixture was stirred for 30 minutes. A ZnMgO dispersion having improved purity was obtained by performing reprecipitation/redispersion 2 to 4 times by using ethyl acetate and ethanol.

Experimental Example 1

Evaluation of Physical Properties of ZnMgO Particles

Figure 7:
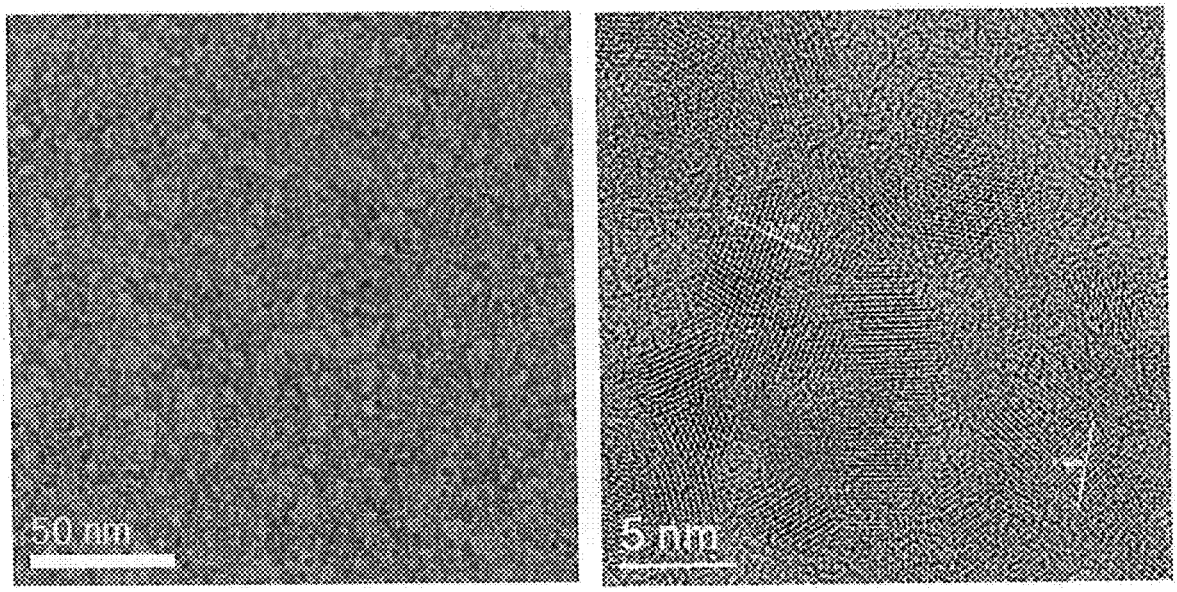
FIG. 7 shows transmission electron microscope (TEM) images of inorganic materials applicable to a second electron transport layer according to an exemplary embodiment of the present disclosure.
Figure 8:
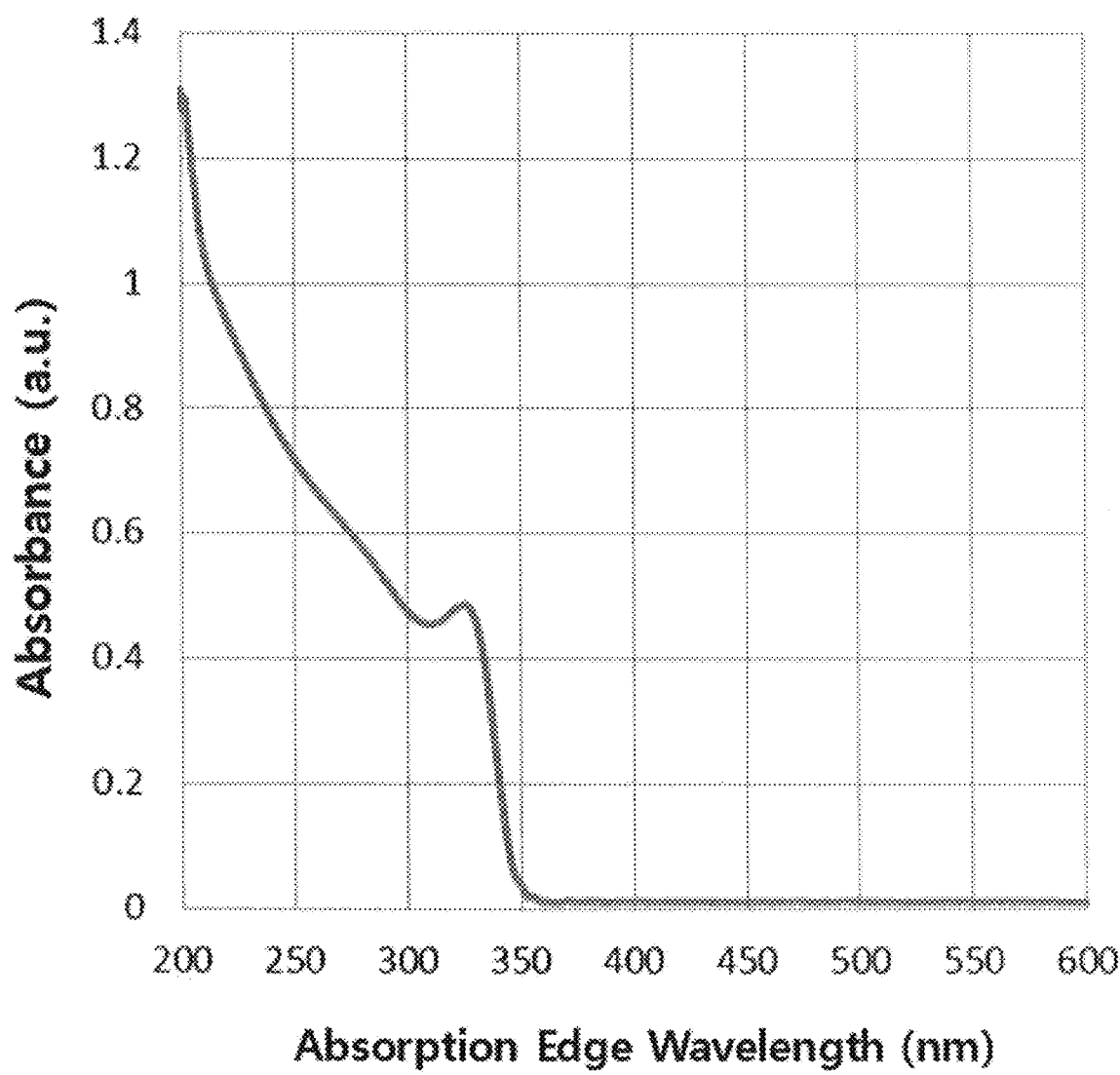
FIG. 8 is a graph showing results of measuring an absorption wavelength of inorganic materials applicable to a second electron transport layer according to an exemplary embodiment of the present disclosure by using a UV-VIS spectrometer.

Physical properties of ZnMgO particles synthesized in Synthesis Example were evaluated. FIG. 7 shows two transmission electron microscope (TEM) images, one with about a 50 nm scale and one with about a 5 nm scale, of ZnMgO particles synthesized in Synthesis Example. FIG. 8 is a graph showing results of measuring an absorption wavelength of ZnMgO particles by using a UV-VIS spectrometer. Meanwhile, Table 1 shows measurement results of physical properties of ZnO particles measured according to the present Experimental Example.

As shown in FIGS. 7 and 8 and Table 1, the ZnMgO particles synthesized in Synthesis Example have an average diameter of 3.7 nm, an absorption edge wavelength ($W_{edge}$), at which a light absorption ratio abruptly drops, is 348 nm, and an energy bandgap is 3.57 eV.

TABLE 1

Physical properties of ZnMgO nanoparticles

| Particles | $W_{edge}$ (nm) | Eg (eV) | Size (TEM, nm) |
|---|---|---|---|
| ZnMgO | 348 | 3.57 | 3.7 |

EXAMPLE 1

Manufacture of LED

Glass had a conductive layer 410 (see FIG. 6) formed, patterned, and cleaned so as to have an emission area of 3 mm×3 mm. Next, an emissive layer and a cathode were stacked in the following sequence. PEDOT:PSS was spin-coated at 7,000 rpm and then was heated at a temperature of 150° C. for 30 minutes to form an HIL having a thickness of 30 nm. TFB (8 mg/mL in toluene) was spin-coated at 4,000 rpm and then was heated at a temperature of 170° C. for 30 minutes to form an HTL having a thickness of 20 nm. InP/ZnSe/ZnS (10 mg/mL in hexane) was spin-coated at 2,000 rpm and then heated at a temperature of 80° C. for 1 hour to form an EML having a thickness of 20 nm: PFNBr (4 mg/mL in methanol) was spin-coated at 4,000 rpm and then was heated at a temperature of 80° C. for 30 minutes to form an ETL1 having a thickness of 20 nm. and ZnMgO (12.5 mg/mL in ethanol) of Synthesis Example was spin-coated and then was heated at a temperature of 80° C. for 30 minutes to form an ETL2 having a thickness of 20 nm.

After a substrate, on which the emissive layer was formed, was mounted in a vacuum chamber, Al was deposited at a base pressure of 1×10$^{-6}$ Torr to form a cathode having a thickness of 80 nm, to correspond to layer 420 of FIG. 6. After the deposition, the substrate was transferred from a deposition chamber to a dry box in order to form a film, and subsequently, encapsulation was performed using UV-curable epoxy and a water getter. An LED has an emission region having an area of 9 mm$^2$. The LED thus formed has respective layers that correspond to the layers shown in FIGS. 2, 3, and 6, as previous described.

EXAMPLE 2

Manufacture of LED

An LED was manufactured by repeating the procedure of Example 1 except that, instead of PFNBr, Bphen was used as an organic material of an ETL1 to form the ETL1 having a thickness of 20 nm.

Comparative Example 1

Manufacture of LED

An LED was manufactured by repeating the procedure of Example 1 except that a 40-nm thick ETL having a single layer structure of a stacked organic material (i.e., PFNBr) was applied.

Comparative Example 2

Manufacture of LED

An LED was manufactured by repeating the procedure of Example 1 except that a 40-nm thick ETL having a single layer structure of a stacked organic material (i.e., Bphen) was applied.

Comparative Example 3

Manufacture of LED

An LED was manufactured by repeating the procedure of Example 1 except that a 40-nm thick ETL having a single layer structure of a stacked inorganic material (i.e., ZnMgO synthesized in Synthesis Example) was applied.

Experimental Example 2

Evaluation of Physical Properties of LED

The LEDs manufactured in Examples 1 and 2 and Comparative Examples 1 to 3 were connected to an external power supply, and EL characteristics of all devices manufactured in the present disclosure were evaluated at room temperature by using a constant current source (KEITHLEY) and a photometer PR 650. Specifically, a driving voltage (V), current efficiency (Cd/A), external quantum efficiency (EQE), and color coordinates with respect to an emission wavelength of the LED manufactured in each of Examples 1 and 2 and Comparative Examples 1 to 3 were measured. Measurement results are shown in Table 2.

TABLE 2

| | | Emission Properties of LED | | | | |
| --- | --- | --- | --- | --- | --- | --- |
| | | 10 mA/cm$^2$ | | | | |
| Sample | ETL | V | Cd/A | Lm/W | EQE (%) | (CIEx, CIEy) |
| Disclosure Example 1 | ETL1: PFNBr ETL2: ZnMgO | 5.48 | 1.76 | 1.00 | 2.84 | (0.640, 0.300) |
| Disclosure Example 2 | ETL1: PFNBr ETL2: ZnMgO | 5.26 | 1.54 | 0.92 | 2.55 | (0.656, 0.303) |
| Comparative Example 1 | ETL1: PFNBr | 7.40 | 0.65 | 0.28 | 1.16 | (0.677, 0.309) |
| Comparative Example 2 | ETL1: Bphen | 8.59 | 0.86 | 0.31 | 1.20 | (0.677, 0.320) |
| Comparative Example 3 | ETL2: ZnMgO | 3.20 | 0.69 | 0.68 | 1.19 | (0.689, 0.310) |

As shown in Table 2, in a case in which an ETL1 made of an organic material and an ETL2 made of an inorganic material are consecutively stacked to form an ETL having an organic-inorganic hybrid structure, a driving voltage is lowered, and emission efficiencies such as current efficiency and power efficiency and external quantum efficiency are improved when compared to a case in which an ETL made of only an organic or inorganic material is applied.

Specifically, in the case in which the ETL having the organic-inorganic hybrid structure is applied, the driving voltage is lowered by up to 38.8% when compared with the case in which the ETL made of only the organic material is applied, as shown in Comparative Examples 1 and 2. In addition, in the case in which the ETL having the organic-inorganic hybrid structure is applied, the current efficiency measured as Cd/A, the power efficiency measured as Lm/W, and the external quantum efficiency EQE(%), as each is shown in Table 2, are respectively improved by up to 170.8%, up to 257.1%, and up to 144.8% in comparison to the case in which the ETL made of only the organic material is applied of Comparative Examples 1 and 2. Furthermore, in the case in which the ETL having the organic-inorganic hybrid structure is applied, the current efficiency, the power efficiency, and the external quantum efficiency are respectively improved by up to 155.1%, up to 47.1%, and up to 138.7% in comparison to the case in which the ETL made of only the inorganic material is applied at Comparative Example 3.

Therefore, according to the present disclosure, a driving voltage may be lowered to reduce power consumption by applying the ETL having the organic-inorganic hybrid structure formed by consecutively forming the ETL1 made of the organic material so as to be adjacent to an EML, and the ETL2 made of the inorganic material adjacent the ETL1. Accordingly, it can be confirmed that it is possible to realize an LED having considerably improved luminous efficiency and quantum efficiency and to use the LED in a light-emitting display device.

The preset disclosure proposes a light-emitting diode which includes an electron transfer layer formed by consecutively forming an ETL1 made of an organic material and a second electrode transport layer made of an inorganic material between an EML and an electron injection electrode, and a light-emitting device.

It is possible to reduce the number of holes from being leaked from the EML by using the electron transfer layer having an organic-inorganic hybrid structure with an appropriate HOMO (or a valence band) energy level and/or a LUMO (or a conduction band) energy level.

An energy barrier related to electron injection is removed, and electrons have an appropriate energy level and are injected into the EML, thereby suppressing the leakage of a current. Electrons can be rapidly injected into the EML, and thus, electric charges can be injected into the EML in a balanced manner.

Therefore, it is possible to realize and manufacture an LED and a light-emitting device having considerably improved emission properties such as luminous efficiency and quantum efficiency by using the electron transfer layer having the organic-inorganic hybrid structure.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the disclosure. Thus, it is intended that the present disclosure cover the modifications and variations of the present disclosure provided they come within the scope of the appended claims and their equivalents.

The various embodiments described above can be combined to provide further embodiments. All of the U.S.

patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting diode comprising:
an anode;
a cathode positioned to face the anode; and
an emissive layer including an emitting material layer and an electron transfer layer, the emitting material layer is located between the anode and the cathode, and the electron transfer layer is located between the cathode and the emitting material layer;
wherein the electron transfer layer includes:
a first electron transport layer adjacent to the emitting material layer, the first electron transport layer including an organic material; and
a second electron transport layer between the first electron transport layer and the cathode, the second electron transport layer including an inorganic material,
wherein the emitting material layer includes inorganic luminescent particles,
wherein the inorganic luminescent particles include semiconductor nanocrystals, and
wherein a highest occupied molecular orbital (HOMO) energy level of the organic material in the first electron transport layer is higher than a HOMO energy level of the semiconductor nanocrystals,
wherein a valance band energy level of the inorganic material in the second electron transport layer ($VB_{ETL2}$) is lower than a highest occupied molecular orbital (HOMO) energy level of the semiconductor nanocrystals in the emitting material layer ($HOMO_{EML}$),
wherein a lowest unoccupied molecular orbital (LUMO) energy level of the first electron transport layer ($LUMO_{ETL1}$) is higher than a LUMO energy level of the emitting material layer ($LUMO_{EML}$), and
wherein a lowest unoccupied molecular orbital (LUMO) energy level of the second electron transport layer ($LUMO_{ETL2}$) is higher than a LUMO energy level of the emitting material layer ($LUMO_{EML}$).

2. The light emitting diode of claim 1, wherein the valence band energy level of the inorganic material in the second electron transport layer ($VB_{ETL2}$) and the HOMO energy level of the semiconductor nanocrystals particles in the emitting material layer ($HOMO_{EML}$) substantially satisfy the relationship below:

$$-1.5\ eV \leq VB_{ETL2} - HOMO_{EML} \leq -0.7\ eV.$$

3. The light emitting diode of claim 1, wherein the LUMO energy level of the first electron transport layer ($LUMO_{ETL1}$) and the LUMO energy level of the emitting material layer ($LUMO_{EML}$) substantially satisfy the relationship below:

$$0.5\ eV \leq LUMO_{ETL1} - LUMO_{EML} \leq 2.8\ eV.$$

4. The light emitting diode of claim 1, wherein a conduction band energy level of the second electron transport layer ($CB_{ETL2}$) is between a lowest unoccupied molecular orbital (LUMO) of the first electron transport layer ($LUMO_{ETL1}$) and a conduction band energy level of the cathode.

5. The light emitting diode of claim 1, wherein a highest occupied molecular orbital (HOMO) energy level of the emitting material layer ($HOMO_{EML}$) is between a HOMO energy level of the first electron transport layer ($HOMO_{ETL1}$) and a valence band energy level of the second electron transport layer ($VB_{ETL2}$).

6. The light emitting diode of claim 1, wherein the inorganic material of the second electron transport layer includes metal oxide particles.

7. The light emitting diode of claim 6, wherein the metal oxide is selected from the group consisting of zinc oxide (ZnO), zinc magnesium oxide (ZnMgO), titanium dioxide ($TiO_2$), zirconium oxide ($ZrO_2$), tin oxide (SnO), tin dioxide ($SnO_2$), tungsten oxide ($WO_3$), tantalum oxide ($Ta_2O_3$), hafnium oxide ($HfO_3$), aluminum oxide ($Al_2O_3$), zirconium silicon oxide ($ZrSiO_4$), barium titanium oxide ($BaTiO_3$), barium zirconium oxide ($BaZrO_3$), and combinations thereof.

8. The light emitting diode of claim 1, wherein the inorganic luminescent particles comprise one or both of quantum dots (QDs) and quantum rods (QRs).

9. The light emitting diode of claim 1, wherein the semiconductor nanocrystals include group of II-VI semiconductor nanocrystals, group of III-V semiconductor nanocrystals, group IV-VI semiconductor nanocrystals, and group of I-III-V semiconductor nanocrystals.

10. The light emitting diode of claim 1, wherein the first electron transport layer is disposed between the emitting material layer and the cathode.

11. The light emitting diode of claim 1, wherein the LUMO energy level of the second electron transport layer ($LUMO_{ETL2}$) is higher than a conduction band energy level of the cathode.

12. The light emitting diode of claim 1, wherein
the LUMO energy level of the first electron transport layer ($LUMO_{ETL1}$) is higher than the LUMO energy level of the second electron transport layer ($LUMO_{ETL2}$) and
the LUMO energy level of the second electron transport layer ($LUMO_{ETL2}$) is higher than a conduction band energy level of the cathode.

13. A light-emitting device comprising:
a substrate; and
a light emitting diode on the substrate, the light emitting diode including:
an anode;
a cathode positioned to face the anode; and
an emissive layer including an emitting material layer and an electron transfer layer, the emitting material layer is located between the anode and the cathode, and the electron transfer layer is located between the cathode and the emitting material layer;
wherein the electron transfer layer includes:
a first electron transport layer adjacent to the emitting material layer, the first electron transport layer including an organic material; and a second electron transport layer between the first electron transport layer and the cathode, the second electron transport layer including an inorganic material, wherein the emitting material layer includes inorganic luminescent particles, wherein the inorganic luminescent particles include semiconductor nanocrystals, and wherein a highest occupied molecular orbital (HOMO) energy level of the organic material in the first electron transport layer and a HOMO energy level of the semiconductor nanocrystals are substantially the same, and wherein a valence band energy level of the inorganic material in the second electron transport layer ($VB_{ETL2}$) is lower than a highest occupied molecular orbital (HOMO) energy level of the semiconductor nanocrystals in in the emitting material layer ($HOMO_{EML}$), wherein a lowest unoccupied molecular orbital (LUMO) energy level of the first electron transport layer ($LUMO_{ETL1}$) is higher than a LUMO energy level of the emitting material layer ($LUMO_{EML}$), and wherein a lowest unoccupied molecular orbital (LUMO) energy level of the second electron transport layer ($LUMO_{ETL2}$) is higher than a LUMO energy level of the emitting material layer ($LUMO_{EML}$).

14. The light-emitting device of claim 13, wherein a conduction band energy level of the second electron transport layer ($CB_{ETL2}$) is between a lowest unoccupied molecular orbital (LUMO) of the first electron transport layer ($LUMO_{ETL1}$) and a conduction band energy level of the cathode.

15. The light-emitting device of claim 13, wherein a highest occupied molecular orbital (HOMO) energy level of the emitting material layer ($HOMO_{EML}$) is between a HOMO energy level of the first electron transport layer ($HOMO_{ETL1}$) and a valence band energy level of the second electron transport layer ($VB_{ETL2}$).

16. The light emitting device of claim 13, wherein the semiconductor nanocrystals include group of II-VI semiconductor nanocrystals, group of III-V semiconductor nanocrystals, group IV-VI semiconductor nanocrystals, and group of I-III-V semiconductor nanocrystals.

17. The light-emitting device of claim 13, wherein the valence band energy level of the inorganic material in the second electron transport layer ($VB_{ETL2}$) and the HOMO energy level of the semiconductor nanocrystals in the emitting material layer ($HOMO_{EML}$) substantially satisfy the relationship below:

$-1.5\ eV \leq VB_{ETL2} - HOMO_{EML} \leq -0.7\ eV.$

18. A light emitting diode comprising:
an anode;
a cathode facing the anode;
an emissive layer including an emitting material layer and an electron transfer layer, the emitting material layer being between the anode and the cathode, and the electron transfer layer being between the cathode and the emitting material layer,
wherein the electron transfer layer includes,
a first electron transport layer adjacent to the emitting material layer, the first electron transport layer including an organic material; and
a second electron transport layer between the first electron transport layer and the cathode, the second electron transport layer including an inorganic material,
wherein the emitting material layer includes one or both of quantum dots (QDs) and quantum rods (QRs),
wherein each of the QDs and the QRs includes a core and a shell surrounding a surface of the core,
wherein each of the core and the shell is made of semiconductor nanocrystals,
wherein a highest occupied molecular orbital (HOMO) energy level of the organic material in the first electron transport layer ($HOMO_{ETL1}$) is higher than a HOMO energy level of the semiconductor nanocrystals of the core or the shell,
wherein a valance band energy level of the inorganic material in the second electron transport layer ($VB_{ETL2}$) is lower than a highest occupied molecular orbital (HOMO) energy level of the core or the shell in the emitting material layer ($HOMO_{EML}$),
wherein a lowest unoccupied molecular orbital (LUMO) energy level of the first electron transport layer ($LUMO_{ETL1}$) is higher than a LUMO energy level of the emitting material layer ($LUMO_{EML}$), and
wherein a lowest unoccupied molecular orbital (LUMO) energy level of the second electron transport layer ($LUMO_{ETL1}$) is higher than a LUMO energy level of the emitting material layer ($LUMO_{EML}$).

19. The light emitting diode of claim 18, wherein the inorganic material of the second electron transport layer includes metal oxide particles.

20. The light emitting diode of claim 18, wherein the semiconductor nanocrystals include group of II-VI semiconductor nanocrystals, group of III-V semiconductor nanocrystals, group IV-VI semiconductor nanocrystals, and group of I-III-V semiconductor nanocrystals.

21. The light-emitting diode of claim 18, wherein the valence band energy level of the inorganic material in the electron transport layer ($VB_{ETL2}$) and the HOMO energy level of the core or the shell in the emitting material layer ($HOMO_{EML}$) substantially satisfy the relationship below:

$-1.5\ eV \leq VB_{ETL2} - HOMO_{EML} \leq -0.7\ eV.$

* * * * *

UNITED STATES PATENT AND TRADEMARK OFFICE
CERTIFICATE OF CORRECTION

PATENT NO. : 11,653,512 B2
APPLICATION NO. : 16/170938
DATED : May 16, 2023
INVENTOR(S) : Seung-Jae Lee et al.

It is certified that error appears in the above-identified patent and that said Letters Patent is hereby corrected as shown below:

In the Claims

Column 25, Claim 1, Line 43:
"a valance band" should read: --a valence band--.

Column 27, Claim 13, Line 19:
"nanocrystals in in the" should read: --nanocrystals in the--.

Column 28, Claim 18, Line 28:
"a valance band" should read: --a valence band--.

Column 28, Claim 18, Line 38:
"($LUMO_{ETL1}$)" should read: --($LUMO_{ETL2}$)--.

Signed and Sealed this
Eighteenth Day of June, 2024

Katherine Kelly Vidal
*Director of the United States Patent and Trademark Office*